(12) United States Patent
Takaya et al.

(10) Patent No.: US 7,167,071 B2
(45) Date of Patent: Jan. 23, 2007

(54) INDUCTIVE DEVICE AND METHOD FOR PRODUCING THE SAME

(75) Inventors: Minoru Takaya, Tokyo (JP); Takashi Kajino, Tokyo (JP); Hisashi Kobuke, Tokyo (JP); Masami Sasaki, Tokyo (JP); Kazuhiko Itoh, Tokyo (JP); Toshikazu Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 71 days.

(21) Appl. No.: 10/799,717

(22) Filed: Mar. 15, 2004

(65) Prior Publication Data

US 2005/0151613 A1 Jul. 14, 2005

(30) Foreign Application Priority Data

Mar. 17, 2003 (JP) ............................. 2003-071196
Dec. 5, 2003 (JP) ............................. 2003-406831

(51) Int. Cl.
*H01F 5/00* (2006.01)
(52) U.S. Cl. ..................... 336/200; 336/232; 336/223; 29/602.1
(58) Field of Classification Search ............... 336/200, 336/223, 232; 29/602.1
See application file for complete search history.

(56) References Cited

U.S. PATENT DOCUMENTS

| | | | | |
|---|---|---|---|---|
| 3,992,691 A | * | 11/1976 | Molthen ..................... | 336/200 |
| 5,116,663 A | * | 5/1992 | Fujimoto et al. ........... | 428/209 |
| 5,479,695 A | | 1/1996 | Grader et al. | |
| 6,135,078 A | * | 10/2000 | Doi et al. ................ | 123/90.18 |
| 6,387,747 B1 | | 5/2002 | Cha et al. | |
| 6,489,875 B1 | * | 12/2002 | Uchikoba et al. ........... | 336/200 |
| 6,864,774 B2 | * | 3/2005 | Kanetaka et al. ............. | 336/83 |
| 2002/0009577 A1 | * | 1/2002 | Takaya et al. ............. | 428/209 |
| 2003/0227664 A1 | * | 12/2003 | Agrawal et al. ........... | 359/269 |

FOREIGN PATENT DOCUMENTS

| | | |
|---|---|---|
| CN | 1375840 A | 10/2002 |
| DE | 198 17 852 | 10/1999 |
| EP | 1 235 235 | 8/2002 |
| GB | 2 348 321 | 9/2000 |
| JP | 58-21807 | 2/1983 |
| JP | 9-330843 | 12/1997 |
| JP | 11-45809 | 2/1999 |
| JP | 2002-124415 | 4/2002 |
| JP | 2002-134321 | 5/2002 |
| JP | 2002-262372 | 9/2002 |
| JP | 2002-324729 | 11/2002 |
| JP | 2003-077726 | 3/2003 |
| JP | 2003-197426 | 7/2003 |
| JP | 2003-197427 | 7/2003 |

\* cited by examiner

*Primary Examiner*—Anh T. Mai
(74) *Attorney, Agent, or Firm*—Oblon, Spivak, McClelland, Maier & Neustadt, P.C.

(57) ABSTRACT

A core material-including organic core board or inorganic sintered board 1 having a plurality of band-shaped conductor patterns 2 formed on its front and rear surfaces is sliced in a direction crossing the band-shaped conductor patterns 2. End portions of the band-shaped conductor patterns 2 exposed on each of cut surfaces of the core board 1 are connected to one another by bridging conductor patterns formed on the cut surfaces. In this manner, at least one helical coil is provided. The inner diameter of the helical coil can be kept constant while coil pitch accuracy can be kept good.

15 Claims, 17 Drawing Sheets

FORMATION OF BRIDGING CONDUCTOR

FORMATION OF PROTECTIVE LAYER

FIG. 1A
PRODUCTION OF BAND-SHAPED CONDUCTOR
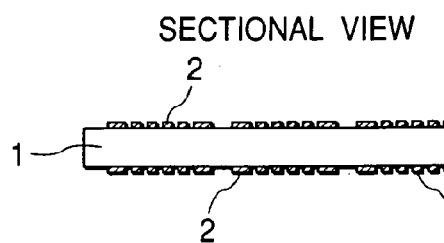
SECTIONAL VIEW
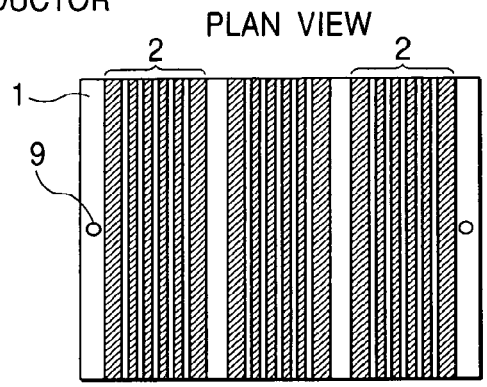
PLAN VIEW
FIG. 1B
LAMINATION
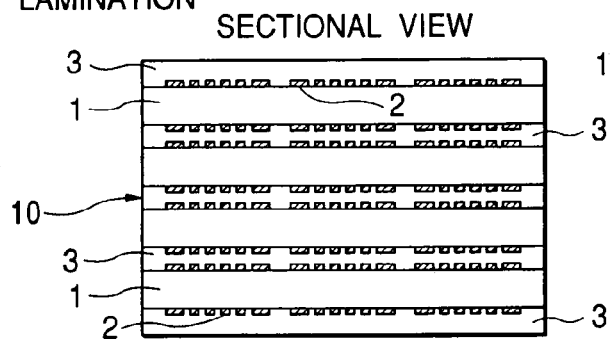
SECTIONAL VIEW
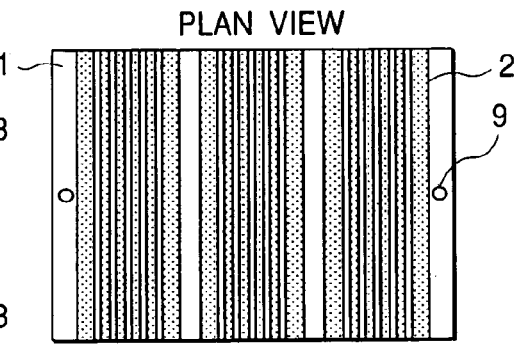
PLAN VIEW
FIG. 1C
SLICING
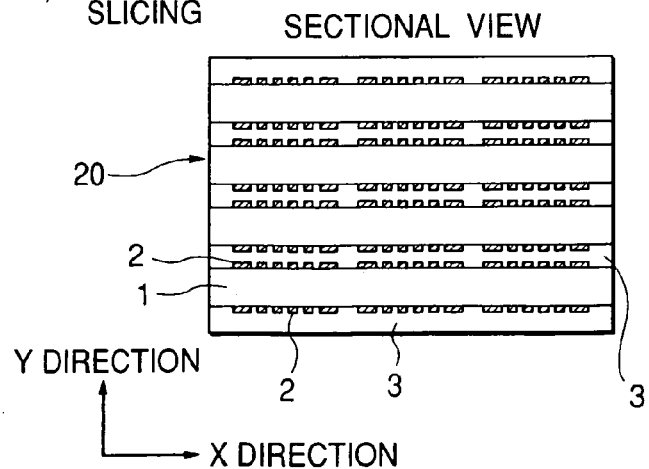
SECTIONAL VIEW
Y DIRECTION
X DIRECTION
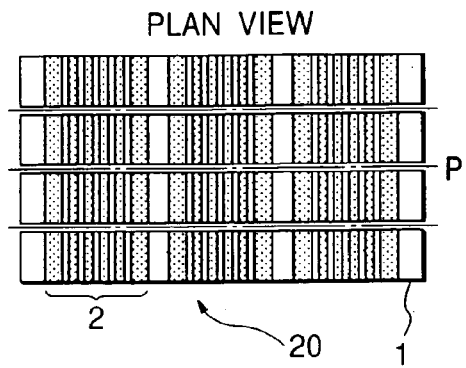
PLAN VIEW

FORMATION OF BRIDGING CONDUCTOR

FORMATION OF PROTECTIVE LAYER

FORMATION OF TERMINAL ELECTRODE

SEPARATION INTO CHIPS

FIG. 3A
PRODUCTION OF BAND-SHAPED CONDUCTOR
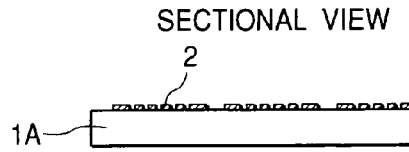
SECTIONAL VIEW
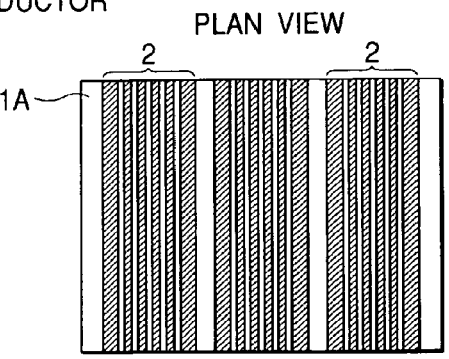
PLAN VIEW
FIG. 3B
LAMINATION
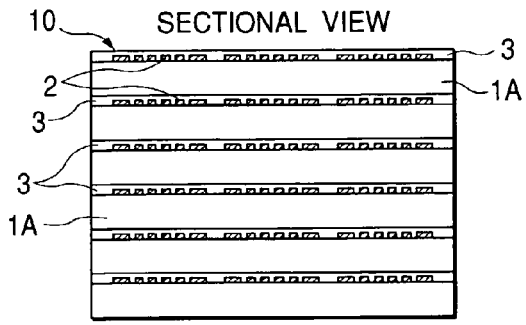
SECTIONAL VIEW
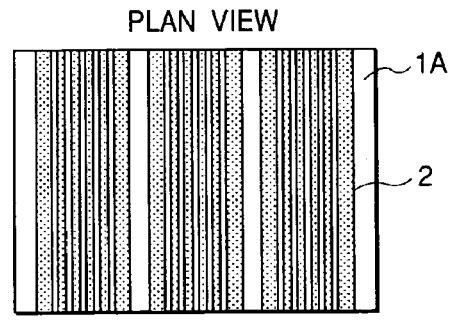
PLAN VIEW
FIG. 3C
SLICING
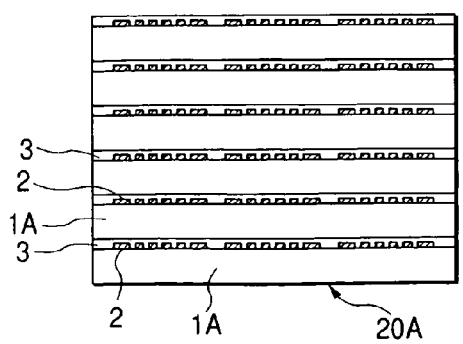
SECTIONAL VIEW
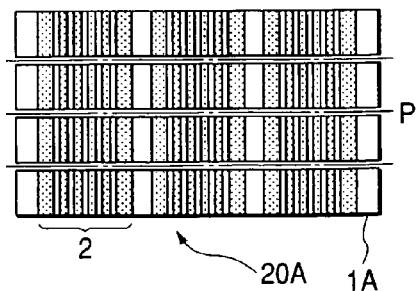
PLAN VIEW

FIG. 4A
FORMATION OF BRIDGING CONDUCTOR
SECTIONAL VIEW
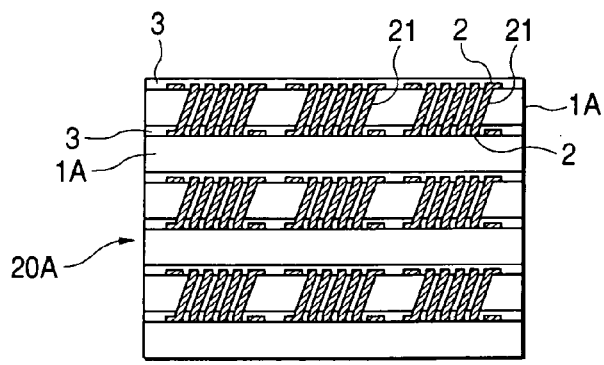
PLAN VIEW
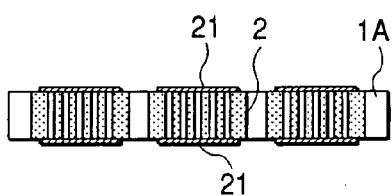
FIG. 4B
FORMATION OF PROTECTIVE LAYER
SECTIONAL VIEW
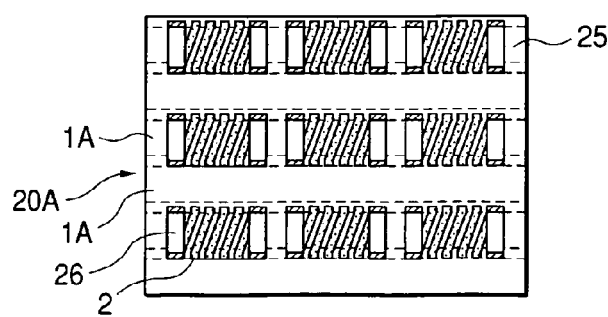
PLAN VIEW
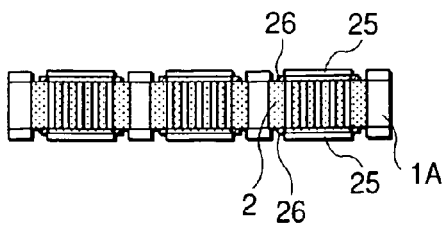

FORMATION OF TERMINAL ELECTRODE

SEPARATION INTO CHIPS

PRODUCTION OF BAND-SHAPED CONDUCTOR

FIRST LAMINATION

SECOND LAMINATION

SLICING

FORMATION OF BRIDGING CONDUCTOR

FORMATION OF PROTECTIVE LAYER

FORMATION OF TERMINAL ELECTRODE

SEPARATION INTO CHIPS

PRODUCTION OF BAND-SHAPED CONDUCTOR

ADJUSTMENT OF BOARD THICKNESS

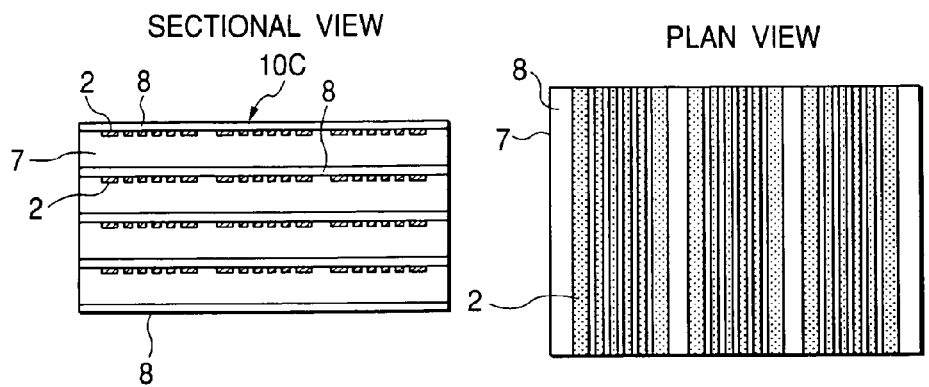
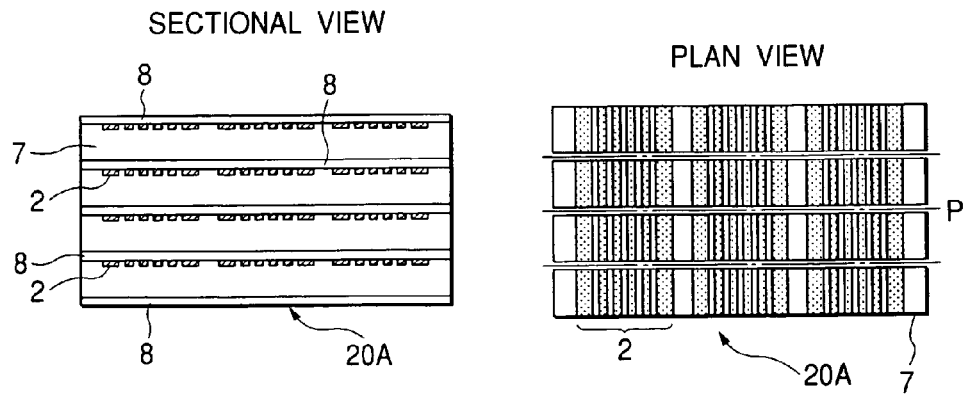

FORMATION OF BRIDGING CONDUCTOR

FORMATION OF PROTECTIVE LAYER

FIG. 8C
FORMATION OF TERMINAL ELECTRODE
SECTIONAL VIEW
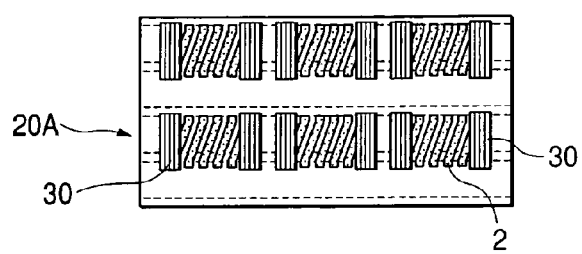
PLAN VIEW
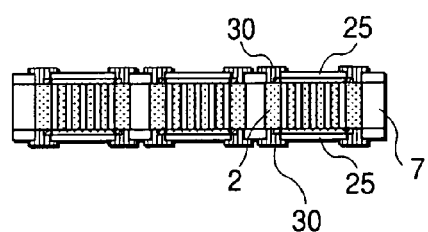
FIG. 8D
SEPARATION INTO CHIPS
SECTIONAL VIEW
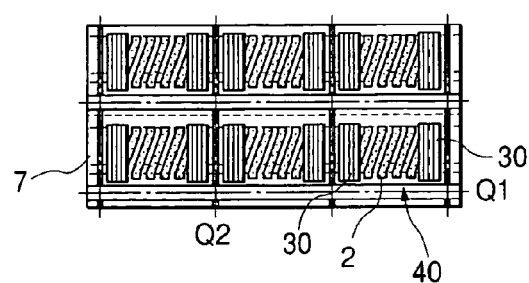
PLAN VIEW
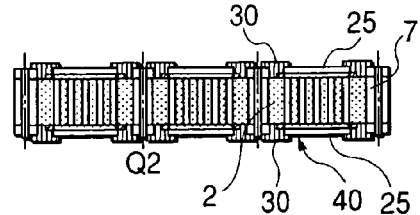

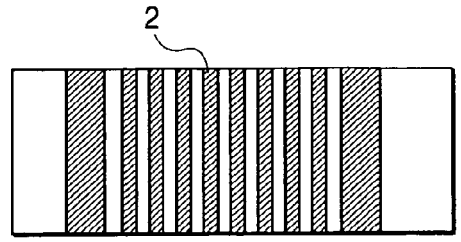
FIG. 9A PLAN VIEW (FRONT PATTERN)
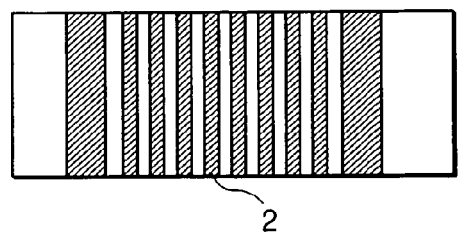
BOTTOM VIEW (REAR PATTERN)
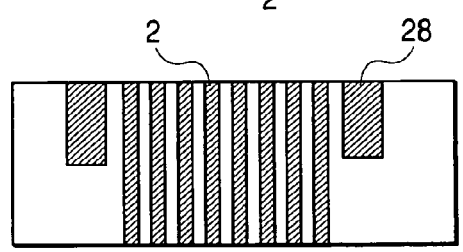
FIG. 9B PLAN VIEW (FRONT PATTERN)
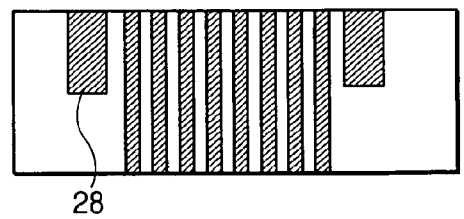
BOTTOM VIEW (REAR PATTERN)
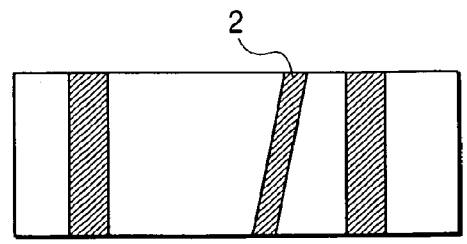
FIG. 9C PLAN VIEW (FRONT PATTERN)
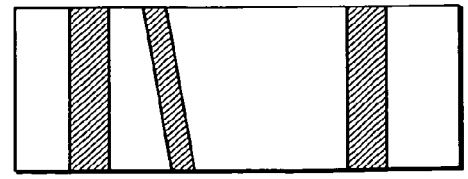
BOTTOM VIEW (REAR PATTERN)

PRODUCTION OF BAND-SHAPED CONDUCTOR

LAMINATION

SLICING

FORMATION OF BRIDGING CONDUCTOR

INDUCTIVE DEVICE AND METHOD FOR PRODUCING THE SAME

BACKGROUND OF THE INVENTION

The present invention relates to an inductive device using a magnetic induction phenomenon of a coil, a transformer, a common mode choke coil, etc. and a method for producing the inductive device. Particularly it relates to a structure of an inductive device permitting mass production of high-performance narrow-tolerance devices and a method for producing the inductive device.

The method for producing this type inductive device has been heretofore roughly classified into the following processes.

(1) Winding Process

This is a most general process in which a wire is wound on a magnetic or non-magnetic core.

(2) Building-up Process

This is a process described in JP-A-2002-134321. In this process, electrically insulating boards having coil conductors provided to form part of a helical coil and electrically insulating layers are laminated alternately to form a helical coil.

The processes have the following problems respectively.

(1) Winding Process a: Performance of a coil is good but tolerance has an inconvenient tendency toward increase.

b: Poor mass production efficiency causes increase in cost because of necessity of winding operation.

(2) Building-up Process a: When the number of turns increases, tolerance becomes high because the number of laminated layers increases.

b: When the number of turns increases, mass production efficiency is lowered because the number of laminated layers increases.

SUMMARY OF THE INVENTION

Under such circumstances, an object of the invention is to provide an inductive device of high performance and narrow tolerance.

Another object of the invention is to provide a method for producing an inductive device with high yield and high mass production efficiency.

According to the present invention, an inductive device comprises: a core board having a core material; a plurality of band-shaped conductor patterns formed on front and rear surfaces of the core board; and bridging conductor patterns formed on cut surfaces of the core board sliced transversely with respect to said band-shaped conductor patterns so that exposed end portions of said band-shaped conductor patterns on each of said cut surfaces of the core board are connected to one another by said bridging conductor patterns to thereby provide at least one helical coil.

The present invention realizes a high-performance narrow-tolerance inductive device which can be mass-produced with high yield.

When an inorganic sintered core board is used as a core board, good yield and reduction in cost can be achieved because the core board is little deformed due to thermal shrinkage, warp, etc. and excellent in dimensional stability so that positional displacement at the time of lamination can be particularly suppressed. When a porous ceramic substance is used as the material of the inorganic sintered core board, good handling can be obtained because the inorganic sintered core board is good in cutting characteristic and higher in strength than the organic board used singly. When a magnetic substance is used as the material of the inorganic sintered core board, there is an advantage in that helical coils can be coupled to each other firmly when a transformer is formed because magnetic permeability can be increased.

BRIEF DESCRIPTION OF THE DRAWINGS

FIGS. 1A to 1C are sectional views and plan views showing a first half of a process according to a first or fifth embodiment of the invention.

FIGS. 3A to 3C are sectional views and plan views showing a first half of a process according to a second or sixth embodiment of the invention.

FIGS. 4A to 4D are sectional views and plan views showing a second half of the process according to the second or sixth embodiment.

FIGS. 7A to 7D are sectional views and plan views showing a first half of a process according to a fourth embodiment of the invention.

FIGS. 8A to 8D are sectional views and plan views showing a second half of the process according to the fourth embodiment.

FIGS. 9A to 9C are plan views and bottom views showing modified examples of the band-shaped conductor patterns in each of the embodiments.

DETAILED DESCRIPTION OF THE PREFERRED EMBODIMENTS

Figure 2A:
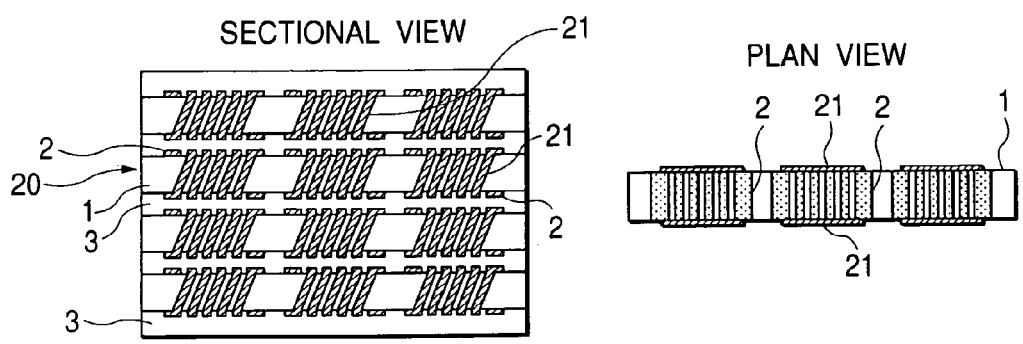
FIGS. 2A to 2D are sectional views and plan views showing a second half of the process according to the first or fifth embodiment.

A best mode for carrying out the invention as to an inductive device and a method for producing the inductive device will be described below with reference to the drawings.

First Embodiment

A first embodiment of the invention will be described with reference to FIGS. 1A to 1C and FIGS. 2A to 2D. First, in the band-shaped conductor production step shown in FIG. 1A, an organic core board 1 having a core material is prepared and a plurality of parallel band-shaped conductor patterns 2 are formed on front and rear surfaces of the board 1 by use of a plurality of front and rear alignment through-holes 9 formed in the board 1.

The core material-including organic core board 1 is a resin board reinforced with a core material impregnated with a resin. Examples of the core material include glass cloth, resin cloth such as Kepler, and a porous sheet of a fluororesin (trade name: Teflon). Additives may be preferably added to the resin, for example, to control a linear expansion coefficient and improve electrical characteristic. Examples of the additives include spherical silica filler, ferroelectric powder such as barium titanate powder, and ferrite powder (composite ferrite). For production of high-frequency parts such as a high-frequency coil, a high-Q low-$\epsilon$ material such as a vinyl benzyl resin is preferably used as the resin.

The plurality of parallel band-shaped conductor patterns 2 are formed by a method of patterning conductor layers by using a subtractive method, a semi-additive method or a full additive method such as transferring. The subtractive method is a method in which: a resist layer corresponding to the band-shaped conductor patterns 2 is formed on a conductor layer; and part of the conductor layer not masked with the resist layer is removed by etching. The subtractive method is the most usual one of printed wiring board-producing methods. The semi-additive method is a method in which: a resist layer is formed on an undercoat conductor layer; part of the undercoat conductor layer corresponding to the band-shaped conductor patterns 2 is exposed; a conductor layer for forming the band-shaped conductor patterns 2 is formed by electroplating so that the conductor layer has a required thickness; and unnecessary part of the undercoat conductor layer is removed after the formation of the conductor layer.

Then, in the lamination step shown in FIG. 1B, a plurality of core material-including organic core boards 1 each having a plurality of parallel band-shaped conductor patterns 2 formed on front and rear surfaces of the board 1 by the step shown in FIG. 1A are piled on one another through interlayer electrically insulating layers (prepregs or adhesive sheets) 3 (inclusive of electrically insulating layers provided as uppermost and lowermost layers respectively to prevent the conductor patterns 2 from being exposed), heated and pressed so as to be laminated integrally. In this manner, a laminated board 10 is obtained. The material of the interlayer electrically insulating layers 3 inclusive of the uppermost and lowermost electrically insulating layers may be the same as the material of the core boards 1. Each of the interlayer electrically insulating layers 3 may contain a core material or may not contain any core material.

In the lamination step, prepregs or adhesive sheets for forming the interlayer electrically insulating layers 3 and the boards 1 are piled alternately and laminated collectively by hot pressing or vacuum pressing. On this occasion, it is necessary to align the boards 1 accurately viewed from above. Examples of the alignment method include pin alignment, alignment using an image, and a method in which outer dimensions of each board 1 are measured accurately so that each board 1 is pressed against an alignment model having at least two sides formed highly accurately on the basis of the measured dimensions. For example, a glass cloth-including vinyl benzyl resin can be preferably used as each of the prepregs. For example, an adhesive film GF3600 (made by Hitachi Chemical Co., Ltd.) having moderate fluidity (permitting absorption of irregularities caused by the conductor patterns 2) can be preferably used as each of the adhesive sheets. Incidentally, the pregregs or adhesive sheets for forming the interlayer electrically insulating layers 3 are preferably selected to be as thin as possible in order to improve pitch accuracy in the laminating direction.

After the lamination step, in the slicing step shown in FIG. 1C, the laminated board obtained in the lamination step is sliced along parting lines P crossing the band-shaped conductor patterns 2 by cutting means such as a multi-wire saw or a multi-blade saw. In this manner, laminated sliced bodies 20 are produced.

Then, in the bridging conductor formation step shown in FIG. 2A, bridging conductor patterns 21 are formed on front and rear surfaces of each laminated sliced body 20 so that end portions of the band-shaped conductor patterns 2 (patterns on respective front and rear surfaces of the boards 1) exposed on each cut surface of the laminated sliced body 20 are connected to one another by the bridging conductor patterns 21. The bridging conductor patterns 21 and the band-shaped conductor patterns 2 on the respective front and rear surfaces of the boards 1 form helical coils. The bridging conductor patterns 21 can be formed in the same manner as the band-shaped conductor patterns 2. That is, the bridging conductor patterns 21 can be formed by a method of patterning conductor layers by using a subtractive method, a semi-additive method or a full additive method.

Figure 2B:
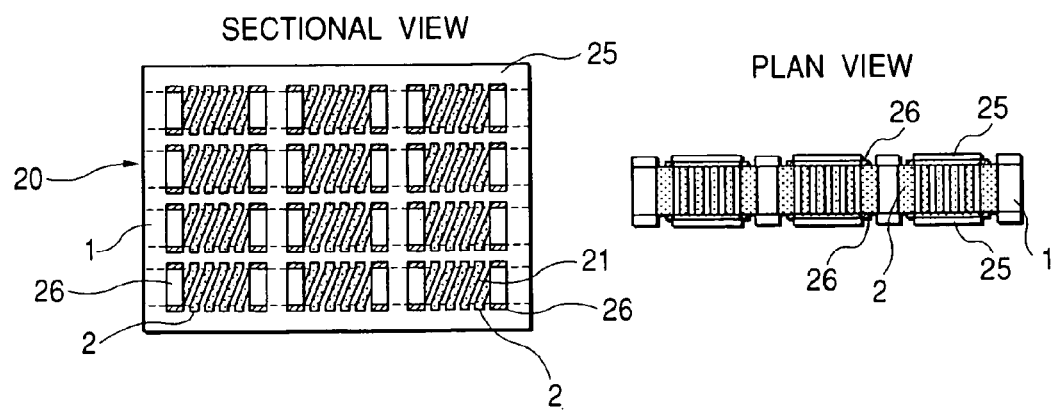

After the formation of the bridging conductor patterns 21, in the protective layer formation step shown in FIG. 2B, protective layers 25 are provided so that the front and rear surfaces of each laminated sliced body 20 are covered with the protective layers 25. A resin such as epoxy, vinyl benzyl or polyimide or the resin containing a filler such as quartz is preferably used as the material of the protective layers 25. From the point of view of thermal expansion, the same material as that of the organic core boards 1 may be more preferably used as the material of the protective layers 25. Via-holes 26 are formed in the protective layers 25 so that end portions of the bridging conductor patterns 21 which serve as end portions of the helical coils are exposed for the purpose of allowing the helical coils to be connected to terminal electrodes which will be formed by the following step. Laser machining, sandblasting, a process of forming linear grooves by a dicer, or the like, may be preferably used as the method for forming the via-holes 26. Alternatively, from the point of view of positional accuracy or mass production efficiency, the via-holes 26 may be preferably formed by photolithography in the condition that a photosensitive epoxy or polyimide resin is used as the material of the protective layers 25.

Figure 2C:
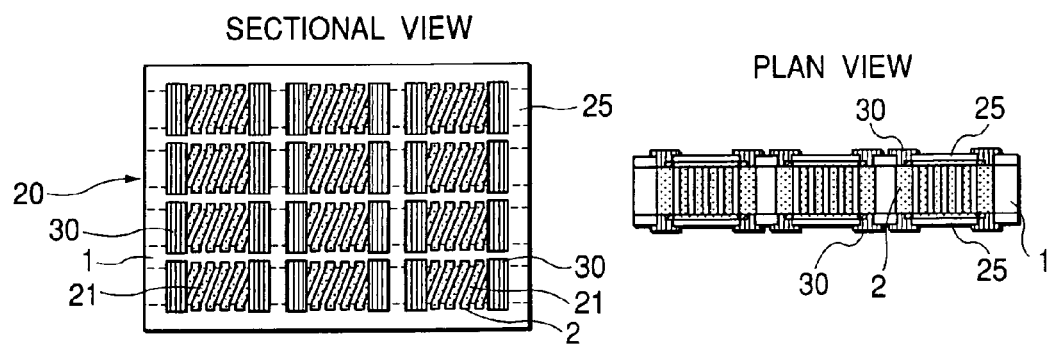

Then, in the terminal electrode formation step shown in FIG. 2C, terminal electrodes 30 to be connected to end portions of the bridging conductor patterns 21 are formed by a process based on the process for forming the band-shaped conductor patterns 2 or the bridging conductor patterns 21. For example, the terminal electrodes 30 are formed by a subtractive method, a semi-additive method, or a full additive method.

Figure 2D:
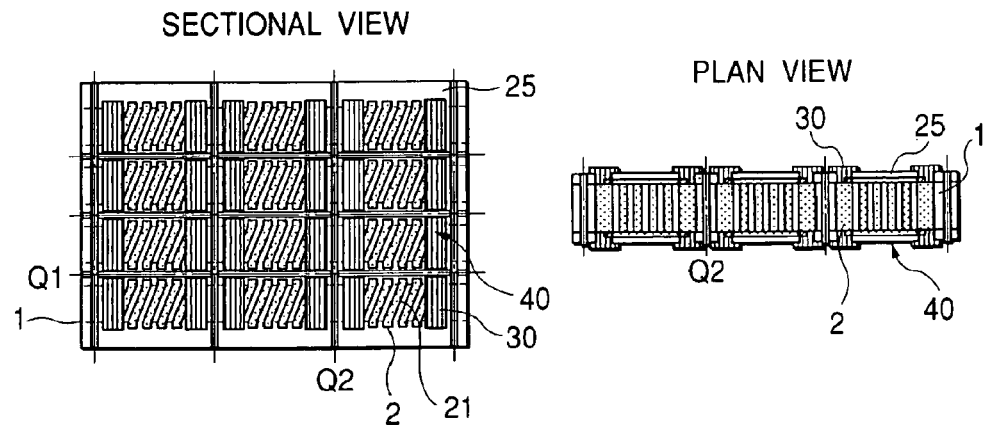

Then, in the chip separation step shown in FIG. 2D, each laminated sliced body 20 is cut along parting lines Q1 and Q2 by cutting means such as a dicing saw so as to be separated into individual chips 40 of inductive devices each having at least one helical coil.

After the separation into chips 40, electroplating layers are formed, for example, in order of nickel and tin on the terminal electrodes 30 by barrel electroplating.

Incidentally, the electroplating may be performed before the separation into chips and just after the formation of the terminal electrodes 30 in the terminal electrode formation step.

Examples of the material of the band-shaped conductor patterns 2 and the bridging conductor patterns 21 include gold, silver, copper, and aluminum. From the point of view of electric resistance and mass-production cost, copper is preferred.

According to the first embodiment, the following effects can be obtained.

(1) Tolerance of the inductance value of the inductive device is narrow for the following reason.

a: Because the organic core board 1 has a core material, cure shrinkage of the board is so small that the board is excellent in dimensional stability. As a result, variation in thickness of the board can be reduced, so that the inner diameter of the helical coil can be kept constant because reduction in variation of thickness of the board is combined with the formation of the band-shaped conductor patterns 2 on opposite surfaces of the board.

b: Shrinkage of the organic core board 1 having the core material is small in the planar direction (perpendicular to the direction of thickness), so that coil pitch accuracy is good.

(2) Yield is good for the following reason.

Because both variation in thickness of the organic core board 1 having the core material and shrinkage of the board in the planar direction are small as described above, the X- and Y-direction arrangement pitch accuracy of inductive devices formed in the organic core board 1 having the core material is good.

(3) Mass production efficiency is good for the following reason.

a: Yield is good.

b: Because the organic core board 1 having the core material is used, the strength of the board is so good that the board can be prevented from cracking in the process.

Second Embodiment

A second embodiment of the invention will be described with reference to FIGS. 3A to 3C and FIGS. 4A to 4D. First, in the band-shaped conductor production step shown in FIG. 3A, a core board 1A is prepared and a plurality of parallel band-shaped conductor patterns 2 are formed on a surface of the board 1A.

A resin board or a resin board reinforced with a core material impregnated with a resin can be used as the core board 1. Examples of the core material include glass cloth, resin cloth such as Kepler, and a porous sheet of a fluororesin (trade name: Teflon). Additives may be preferably added to the resin as a main material, for example, to control a linear expansion coefficient and improve electrical characteristic. Examples of the additives include spherical silica filler, ferroelectric powder such as barium titanate powder, and ferrite powder (composite ferrite). For production of high-frequency parts such as a high-frequency coil, a high-Q low-$\epsilon$ material such as a vinyl benzyl resin is preferably used as the resin. A board of an inorganic substance such as quartz, glass, alumina or ferrite may be also used as the core board 1A. For the other purpose than the high-frequency purpose, a permalloy board or a metal board formed from thin sheets of permalloy laminated through thin electrically insulating layers may be used. Incidentally, when a metal board is used as the core board 1A, an electrically insulating adhesive sheet needs to be provided on a surface of the metal board on which the band-shaped conductor patterns 2 will be provided.

The plurality of parallel band-shaped conductor patterns 2 can be formed by the same process as used in the first embodiment.

Then, in the lamination step shown in FIG. 3B, a plurality of core boards 1A each having a plurality of parallel band-shaped conductor patterns 2 formed on a surface of the board 1A by the step shown in FIG. 3A are piled on one another through interlayer electrically insulating layers (prepregs or adhesive sheets) 3 (inclusive of an electrically insulating layer provided as an uppermost layer to prevent the conductor patterns 2 from being exposed), heated and pressed so as to be laminated integrally. In this manner, a laminated board 10A is obtained. When each core board 1A is made of an organic substance, the material of the interlayer electrically insulating layers 3 may be the same as that of the core boards 1A. When the interlayer electrically insulating layers 3 are resin layers, the core material may be provided or may be not provided. When an inorganic substance is used as the material of the interlayer electrically insulating layers 3, the core boards 1A are laminated through the interlayer electrically insulating layers 3 formed in the condition that thin electrically insulating adhesive sheets are provided on opposite surfaces of each interlayer electrically insulating layer 3. An adhesive film GF3600 (made by Hitachi Chemical Co., Ltd.) having moderate fluidity (permitting absorption of irregularities caused by the conductor patterns 2) can be preferably used as each of the adhesive sheets used in this embodiment. The other condition in the lamination step may be the same as in the first embodiment.

After the lamination step, in the slicing step shown in FIG. 3C, the laminated board obtained in the lamination step is sliced along parting lines P crossing the band-shaped conductor patterns 2 by cutting means such as a multi-wire saw or a multi-blade saw. In this manner, laminated sliced bodies 20A are produced.

Then, in the bridging conductor formation step shown in FIG. 4A, bridging conductor patterns 21 are formed on cut surfaces of each laminated sliced body 20A so that end portions of the band-shaped conductor patterns 2 (patterns on each pair of upper and lower core boards 1A) exposed on each cut surface of the laminated sliced body 20A are connected to one another by the bridging conductor patterns 21. The bridging conductor patterns 21 and the band-shaped conductor patterns 2 on the pair of core boards 1A form helical coils. The bridging conductor patterns 21 can be formed in the same manner as the band-shaped conductor patterns 2. That is, the bridging conductor patterns 21 can be formed by a method of patterning conductor layers by using a subtractive method, a semi-additive method or a full additive method.

Figure 4C:
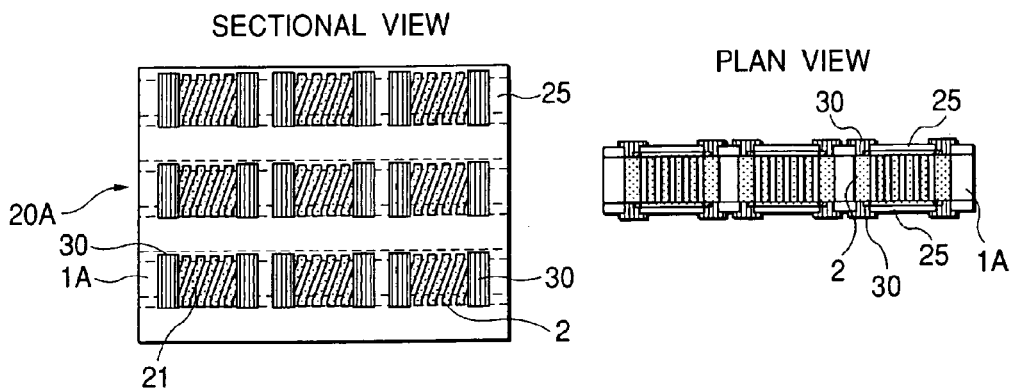
Figure 4D:
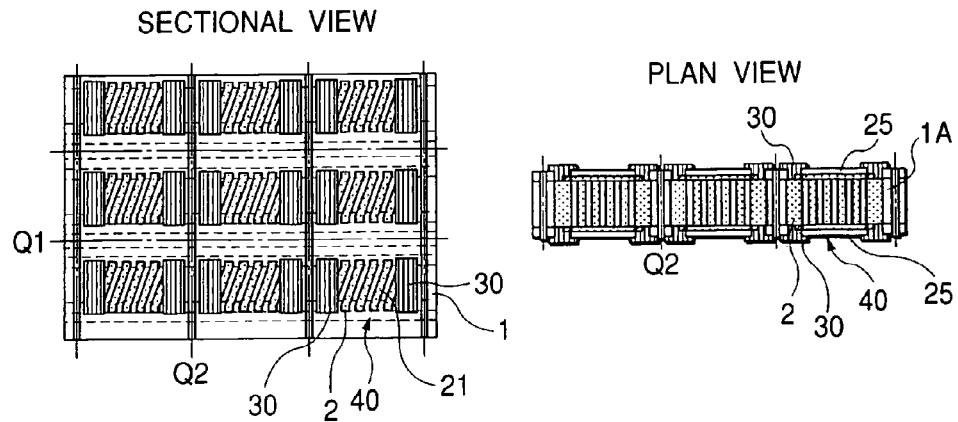

Thereafter, the protective layer formation step shown in FIG. 4B, the terminal electrode formation step shown in FIG. 4C and the chip separation step shown in FIG. 4D can be performed in the same manner as in the first embodiment. Although the first embodiment shows the case where each laminated sliced body is cut along portions of the interlayer electrically insulating layers in the chip separation step, the second embodiment shows the case where each laminated sliced body is cut along parting lines Q1 each located in an intermediate position of the thickness of a corresponding core board 1A. Detailed description of other parts will be omitted because parts the same as or equivalent to those in the first embodiment are denoted by the same reference numerals as those in the first embodiment.

According to the second embodiment, the band-shaped conductor patterns 2 can be formed on only one surface of each core board 1A, so that the process can be simplified. It is possible to avoid lowering of yield caused by misalignment of the front and rear conductor patterns as a problem which occurs when the band-shaped conductor patterns 2 are formed on front and rear surfaces of each core board.

Incidentally, the lamination method used in the lamination step in the second embodiment may be performed as follows. That is, core boards each having parallel band-shaped conductor patterns formed on a surface of the core board may be laminated so that the surfaces on which the parallel band-shaped conductor patterns are formed are inverted alternately.

Third Embodiment

A third embodiment of the invention will be described with reference to FIGS. 5A to 5D and FIGS. 6A to 6D. First, in the band-shaped conductor production step shown in FIG. 5A, an organic core board 1 having a core material is prepared and a plurality of parallel band-shaped conductor patterns 2 are formed on front and rear surfaces of the organic core board 1 by use of a plurality of front and rear alignment through-holes 9 formed in the organic core board 1. This step is the same as in the first embodiment.

Figure 5A:
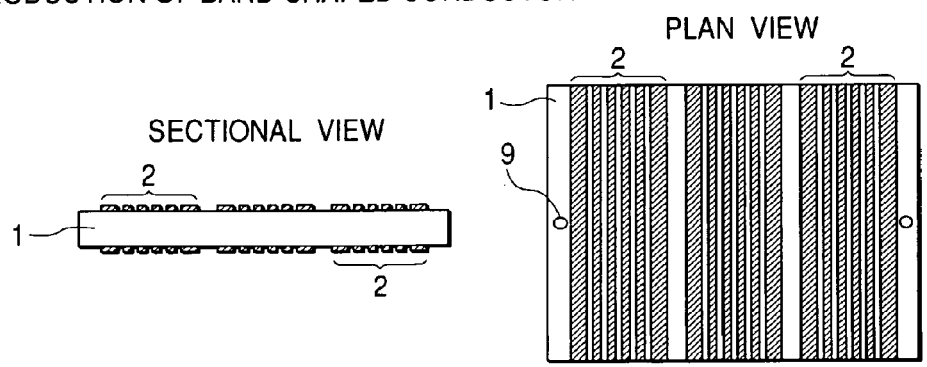
FIGS. 5A to 5D are sectional views and plan views showing a first half of a process according to a third or seventh embodiment of the invention.
Figure 5B:
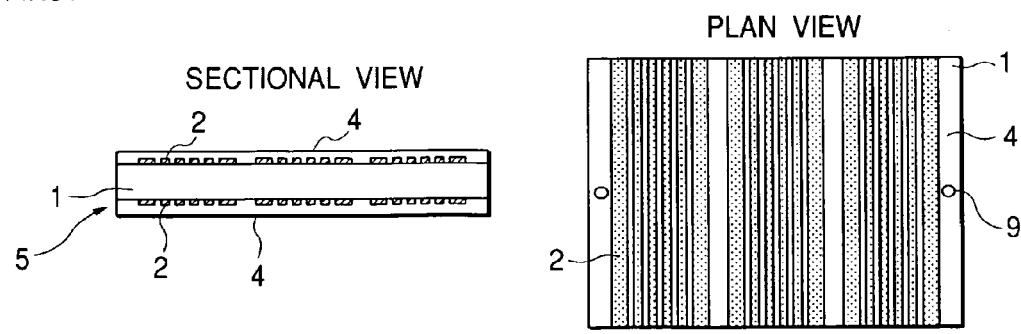

Then, in the first lamination step shown in FIG. 5B, interlayer electrically insulating layers (prepregs or adhesive sheets) 4 are put on front and rear surfaces of the organic core board 1 having the parallel band-shaped conductor patterns 2 formed on its front and rear surfaces in the band-shaped conductor production step. The interlayer electrically insulating layers 4 and the organic core board 1 are laminated integrally by pressing, heating, etc. In this manner, a laminate 5 is produced so that the front and rear surfaces of the board are covered with the interlayer electrically insulating layers 4. Prepregs or adhesive sheets can be used for forming the interlayer electrically insulating layers 4. For example, a vinyl benzyl resin can be preferably used as each of the prepregs. For example, an adhesive film GF3600 (made by Hitachi Chemical Co., Ltd.) having moderate fluidity (permitting absorption of irregularities caused by the conductor patterns 2) can be preferably used as each of the adhesive sheets. Incidentally, upper and lower surfaces of the laminate 5 are formed as flat surfaces parallel to each other. If necessary, the upper and lower surfaces of the laminate 5 may be preferably polished in order to obtain accuracy of thickness of the laminate 5.

Figure 5C:
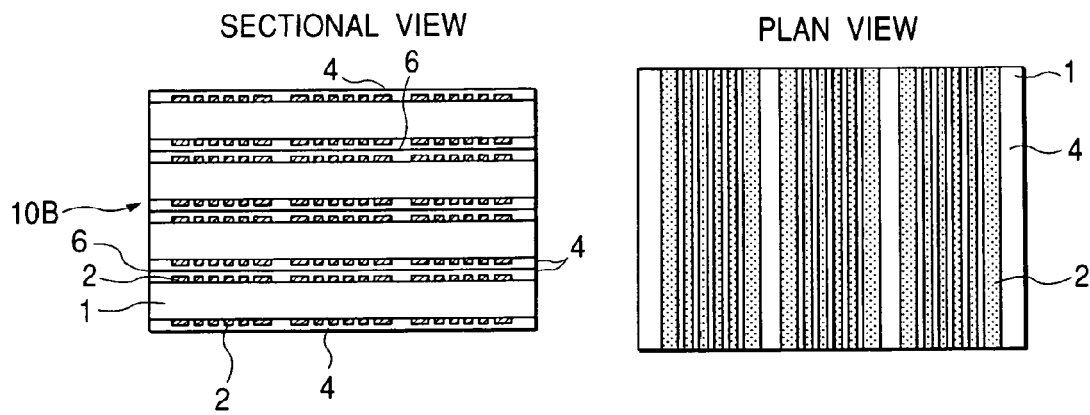

Then, in the second lamination step shown in FIG. 5C, laminates 5 produced in FIG. 5B and adhesive sheets 6 as adhesive layers are piled alternately and laminated integrally by hot pressing or vacuum pressing. In this manner, a laminated board 10B is produced. On this occasion, alignment is required so that the laminates 5 can be piled accurately viewed from above. The alignment can be performed in the same manner as in the first embodiment.

A material exhibiting fluidity as low as possible at the time of pressing is preferably used as the material of the adhesive sheets 6 in the second lamination step. For this reason, for example, a technique of increasing the degree of cure of the resin used as the material of the adhesive sheets may be used. An adhesive film GF3500 (made by Hitachi Chemical Co., Ltd.) having low fluidity can be preferably used as each of the adhesive sheets 6. Incidentally, the thickness of each adhesive sheet 6 is preferably selected to be as small as possible in order to improve pitch accuracy in the laminating direction (for positioning bridging conductor patterns 21). An electrically conductive material may be also used as the material of the adhesive sheets 6. For example, a brass or aluminum board having front and rear surfaces coated with thin films of an adhesive agent may be used as the electrically conductive material. As a result, mechanical strength of the boards and laminates in the step can be improved more greatly, and pitch accuracy can be also improved.

Figure 5D:
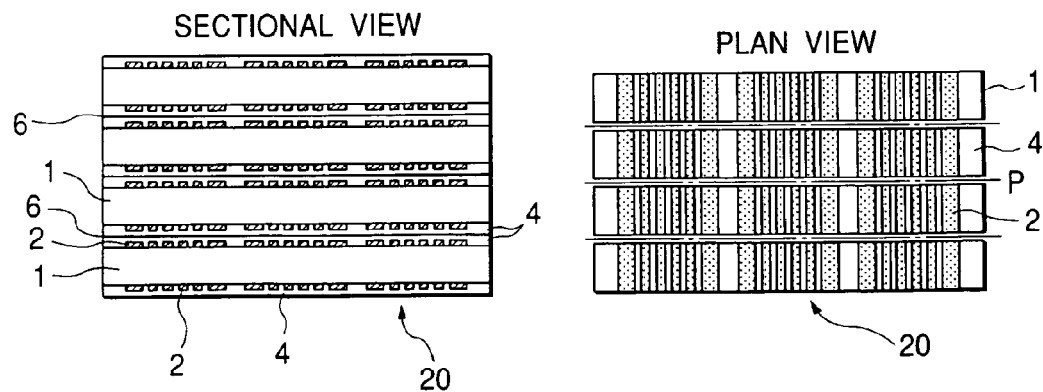
Figure 6A:
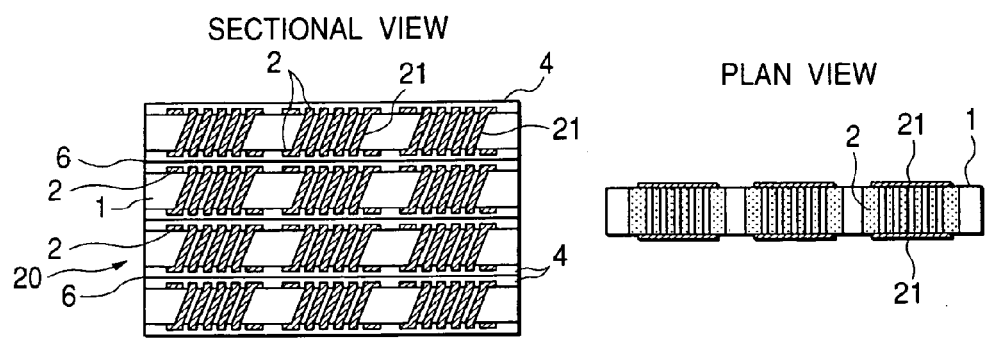
FIGS. 6A to 6D are sectional views and plan views showing a second half of the process according to the third or seventh embodiment.
Figure 6B:
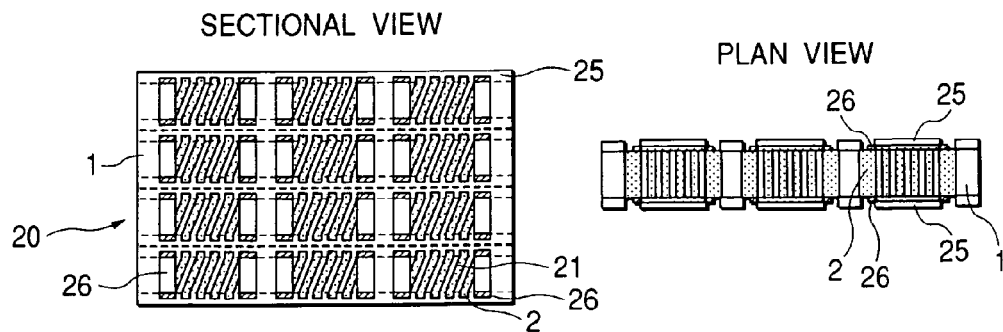
Figure 6C:
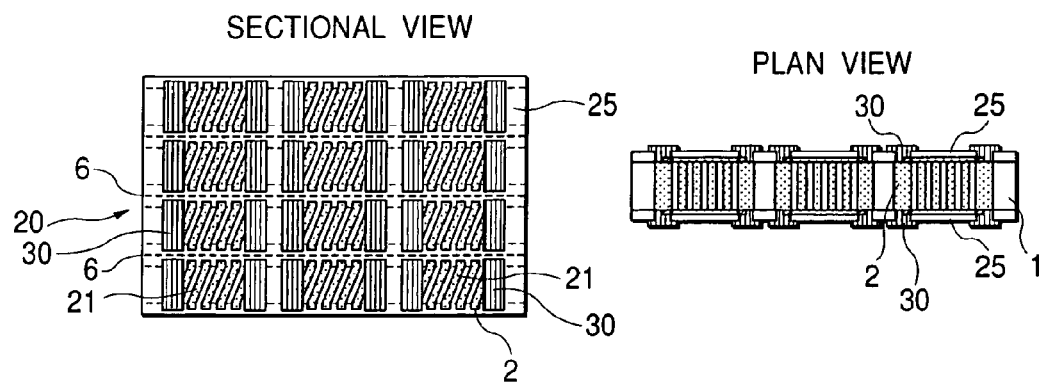
Figure 6D:
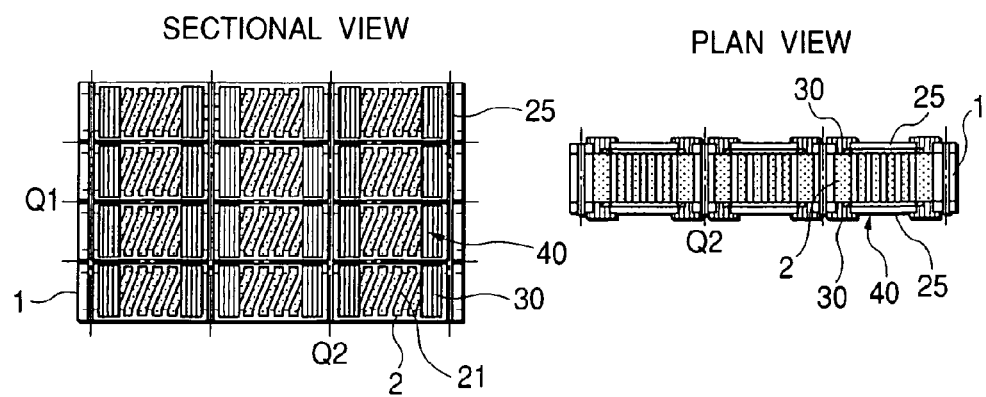

Thereafter, the slicing step shown in FIG. 5D, the bridging conductor formation step shown in FIG. 6A, the protective layer formation step shown in FIG. 6B, the terminal electrode formation step shown in FIG. 6C and the chip separation step shown in FIG. 6D can be performed in the same manner as in the first embodiment. Detailed description of other parts will be omitted because parts the same as or equivalent to those in the first embodiment are denoted by the same reference numerals as those in the first embodiment.

According to the third embodiment, the interlayer electrically insulating layers 4 are formed to be as thin as possible in the first lamination step (and the laminate 5 after the formation of the interlayer electrically insulating layers is polished and ground by a grinder etc. if necessary) so that accuracy of thickness of the laminate 5 is increased. In addition, the adhesive sheets 6 as thin as possible and exhibiting low fluidity at the time of pressing are used in the second lamination step. Accordingly, laminating direction pitch accuracy of inductive devices included in the laminated board 10B can be improved, so that positional displacement of the bridging conductor patterns 21 relative to the band-shaped conductor patterns 2 can be prevented in the bridging conductor formation step shown in FIG. 6A. Accordingly, greater improvement of yield can be attained. Incidentally, other operations and effects are the same as those in the first embodiment.

The third embodiment can be also applied to the case where the band-shaped conductor patterns are formed on a single surface of each core board. In this case, each laminated sliced body can be cut along parting lines each located in an intermediate position of the thickness of a corresponding core board in the same manner as in the second embodiment after the band-shaped conductor patterns formed on each pair of upper and lower core boards are connected to each other by the bridging conductor patterns. Incidentally, the adhesive layers are limited to electrically insulating adhesive layers.

Fourth Embodiment

Figure 7A:
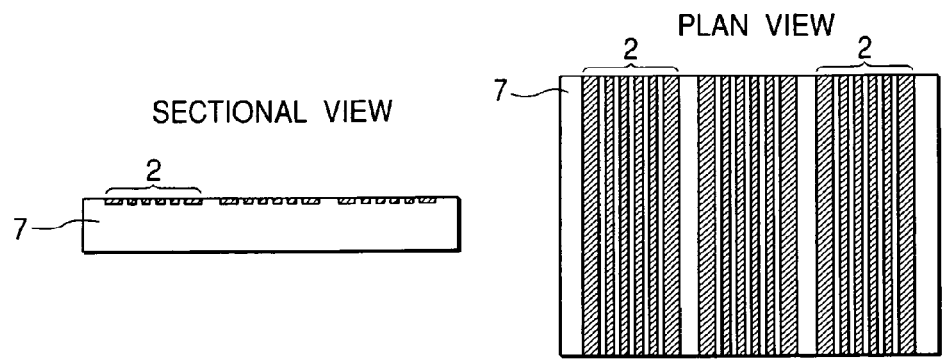

A fourth embodiment of the invention will be described with reference to FIGS. 7A to 7D and FIGS. 8A to 8D. First, in the band-shaped conductor production step shown in FIG. 7A, a prepreg is prepared as a core board 7 and parallel band-shaped conductor patterns 2 with a predetermined thickness are formed on an electrically conductive transfer board by a pattern plating method. The prepreg is put on the transfer board, pressed (vacuum-pressed) and heated. After the prepreg is cured, the transfer board is separated from the prepreg. In this manner, the parallel band-shaped conductor patterns 2 are formed on a single surface of the core board 7 by transferring as shown in FIG. 7A. Incidentally, the core board 7 is formed by curing the resin sheet or prepreg which is half-cured at the time of transferring in order to transfer the parallel band-shaped conductor patterns 2. The core board 7 is a resin board reinforced with a core material impregnated with a resin. Examples of the core material include glass cloth, resin cloth such as Kepler, and a porous sheet of a fluororesin (trade name: Teflon). Additives may be preferably added to the resin, for example, to control a linear expansion coefficient and improve electrical characteristic. Examples of the additives include spherical silica filler, ferroelectric powder such as barium titanate powder, and ferrite powder (composite ferrite). For production of high-frequency parts such as a high-frequency coil, a high-Q low-$\epsilon$ material such as a vinyl benzyl resin is preferably used as the resin. In the band-shaped conductor production step, because the parallel band-shaped conductor patterns 2 are transferred onto a single surface of the core board 7 which is half-cured at the time of transferring, the surface of the core board 7 onto which the conductor patterns 2 are transferred can become smooth. The term "smooth" means a surface state in which Rmax is not larger than 10 μm, preferably not larger than 5 μm, most preferably not larger than 2 μm.

Figure 7B:
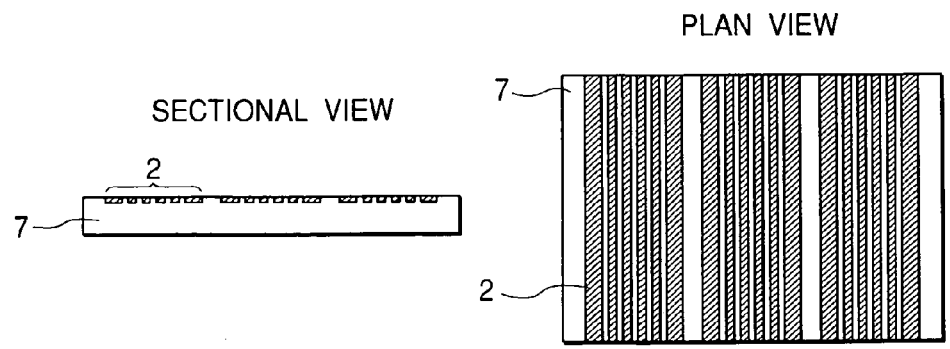

Then, in the board thickness adjustment step shown in FIG. 7B, a polishing process of grinding and polishing a surface opposite to the surface of the core board 7 onto which the conductor patterns 2 are transferred is carried out to adjust the thickness of the board to a predetermined value.

Then, in the lamination step shown in FIG. 7C, a plurality of core boards 7 each having a plurality of parallel band-shaped conductor patterns 2 formed on a single surface of the core board 7 as prepared by the step shown in FIG. 7B are piled through electrically insulating adhesive sheets 8 (inclusive of an adhesive sheet 8 provided as the uppermost layer to prevent the conductor patterns 2 from being exposed) as thin as possible as adhesive layers. The plurality of core boards 7 are heated and pressed so as to be laminated integrally. In this manner, a laminated board 10C is obtained. An adhesive film GF3500 (made by Hitachi Chemical Co., Ltd.) having low fluidity can be preferably used as the material of the adhesive sheets 8.

Figure 8A:
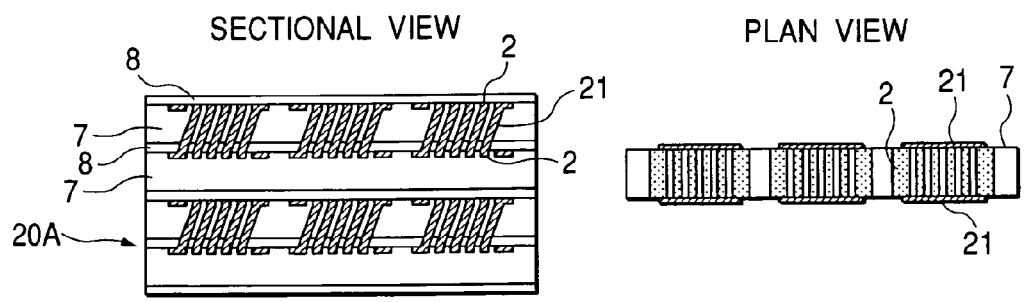
Figure 8B:
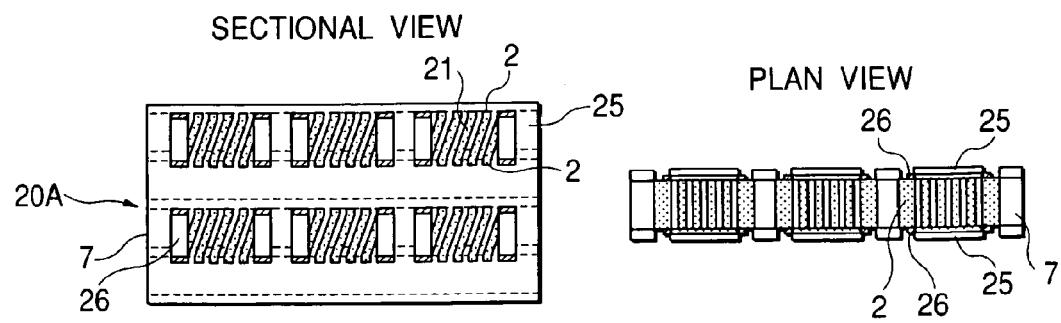

Thereafter, the slicing step shown in FIG. 7D, the bridging conductor formation step shown in FIG. 8A, the protective layer formation step shown in FIG. 8B, the terminal electrode formation step shown in FIG. 8C and the chip separation step shown in FIG. 8D can be performed in the same manner as in the second embodiment. Detailed description of other parts will be omitted because parts the same as or equivalent to those in the second embodiment are denoted by the same reference numerals as those in the second embodiment.

According to the fourth embodiment, the band-shaped conductor patterns 2 are transferred onto a single surface of each core board 7, and the surface of each core board 7 on which the band-shaped conductor patterns 2 are arranged is smoothened. In addition, the thickness of each core board 7 can be controlled to a predetermined value highly accurately by the board thickness adjustment step.

Because the opposite surfaces of each core board 7 are smoothened, not only can thin and low-fluidity adhesive sheets 8 be used but also pressure used in the lamination step can be reduced. For this reason, pitch accuracy in the laminating direction is very good. In addition to the operations and effects obtained in the second embodiment, laminating-direction pitch accuracy of inductive devices included in the laminated board 10C can be made very good, so that positional displacement of the bridging conductor patterns 21 relative to the band-shaped conductor patterns 2 can be suppressed in the bridging conductor formation step shown in FIG. 8A. Accordingly, greater improvement of yield can be attained.

The lamination method used in the lamination step in the fourth embodiment may be performed as follows. That is, core boards each having parallel band-shaped conductor patterns formed on a surface of the core board may be laminated so that the surfaces on which the parallel band-shaped conductor patterns are formed are inverted alternately.

Incidentally, the configuration of the fourth embodiment in which: band-shaped conductor patterns are transferred onto a surface of each core board; and the surface of each core board on which the band-shaped conductor patterns are arranged is smoothened may be applied to the first, second and third embodiments.

Fifth Embodiment

A fifth embodiment of the invention will be described with reference to FIGS. 1A to 1C and FIGS. 2A to 2D. In the fifth embodiment, inorganic sintered core boards are used in place of the core material-including organic core boards. First, in the band-shaped conductor production step shown in FIG. 1A, an inorganic sintered core board 1 is prepared and a plurality of parallel band-shaped conductor patterns 2 are formed on front and rear surfaces of the board 1 by use of a plurality of front and rear alignment through-holes 9 formed in the board 1. In this case, the conductor patterns 2 may be formed after the core board 1 is sintered. Or conductor paste may be provided on a non-sintered core board in advance so that the conductor patterns 2 can be formed while the core board 1 is sintered.

A magnetic substance such as ferrite may be used as the material of the inorganic sintered core board 1 from the point of view of magnetic characteristic. Or a porous ceramic substance good in cutting characteristic at the time of production may be used as the material of the inorganic sintered core board 1.

The plurality of parallel band-shaped conductor patterns 2 are formed by a method of patterning conductor layers by using a subtractive method, a semi-additive method or a full additive method.

Then, in the lamination step shown in FIG. 1B, a plurality of inorganic sintered core boards 1 each having a plurality of parallel band-shaped conductor patterns 2 formed on front and rear surfaces of the inorganic sintered core board 1 by the step shown in FIG. 1A are piled on one another through interlayer electrically insulating layers (prepregs or adhesive sheets) 3 (inclusive of electrically insulating layers provided as uppermost and lowermost layers respectively to prevent the conductor patterns 2 from being exposed), heated and pressed so as to be laminated integrally. In this manner, a laminated board 10 is obtained. Each of the interlayer electrically insulating layers 3 may contain a core material or may not contain any core material.

In the lamination step, prepregs or adhesive sheets for forming the interlayer electrically insulating layers 3 and the boards 1 are piled alternately and laminated collectively by hot pressing or vacuum pressing. On this occasion, it is necessary to align the boards 1 accurately viewed from above. Examples of the alignment method include pin alignment, alignment using an image, and a method in which outer dimensions of each board 1 are measured accurately so that each board 1 is pressed against an alignment model having at least two sides formed highly accurately on the basis of the measured dimensions. For example, a glass cloth-including vinyl benzyl resin can be preferably used as each of the prepregs. For example, an adhesive film GF3600 (made by Hitachi Chemical Co., Ltd.) having moderate fluidity (permitting absorption of irregularities caused by the conductor patterns 2) can be preferably used as each of the adhesive sheets. Incidentally, the prepregs or adhesive sheets for forming the interlayer electrically insulating layers 3 are preferably selected to be as thin as possible in order to improve pitch accuracy in the laminating direction.

After the lamination step, in the slicing step shown in FIG. 1C, the laminated board obtained in the lamination step is sliced along parting lines P crossing the band-shaped conductor patterns 2 by cutting means such as a multi-wire saw or a multi-blade saw. In this manner, laminated sliced bodies 20 are produced.

Then, in the bridging conductor formation step shown in FIG. 2A, bridging conductor patterns 21 are formed on front and rear surfaces of each laminated sliced body 20 so that end portions of the band-shaped conductor patterns 2 (patterns on respective front and rear surfaces of the boards 1) exposed on each cut surface of the laminated sliced body 20 are connected to one another by the bridging conductor patterns 21. The bridging conductor patterns 21 and the band-shaped conductor patterns 2 on the respective front and rear surfaces of the boards 1 form helical coils. The bridging conductor patterns 21 can be formed in the same manner as the band-shaped conductor patterns 2. That is, the bridging conductor patterns 21 can be formed by a method of patterning conductor layers by using a subtractive method, a semi-additive method or a full additive method.

After the formation of the bridging conductor patterns 21, in the protective layer formation step shown in FIG. 2B, protective layers 25 are provided so that the front and rear surfaces of each laminated sliced body 20 are covered with the protective layers 25. A resin such as epoxy, vinyl benzyl or polyimide or the resin containing a filler such as quartz is preferably used as the material of the protective layers 25. Via-holes 26 are formed in the protective layers 25 so that end portions of the bridging conductor patterns 21 which serve as end portions of the helical coils are exposed for the purpose of allowing the helical coils to be connected to terminal electrodes which will be formed by the following step. Laser machining, sandblasting, a process of forming linear grooves by a dicer, or the like, may be preferably used as the method for forming the via-holes 26. Alternatively, from the point of view of positional accuracy or mass production efficiency, the via-holes 26 may be preferably formed by photolithography in the condition that a photosensitive epoxy or polyimide resin is used as the material of the protective layers 25.

Then, in the terminal electrode formation step shown in FIG. 2C, terminal electrodes 30 to be connected to end portions of the bridging conductor patterns 21 are formed by a process based on the process for forming the band-shaped conductor patterns 2 or the bridging conductor patterns 21. For example, the terminal electrodes 30 are formed by a subtractive method, a semi-additive method, or a full additive method.

Then, in the chip separation step shown in FIG. 2D, each laminated sliced body 20 is cut along parting lines Q1 and Q2 by cutting means such as a dicing saw so as to be separated into individual chips 40 of inductive devices each having at least one helical coil.

After the separation into chips 40, electroplating layers are formed, for example, in order of nickel and tin on the terminal electrodes 30 by barrel electroplating.

Incidentally, the electroplating may be performed before the separation into chips and just after the formation of the terminal electrodes 30 in the terminal electrode formation step.

Examples of the material of the band-shaped conductor patterns 2 and the bridging conductor patterns 21 include gold, silver, copper, and aluminum. From the point of view of electric resistance and mass-production cost, copper is preferred.

According to the fifth embodiment, the following effects can be obtained.

(1) Tolerance of the inductance value of the inductive device is narrow for the following reason.

a: Because the inorganic sintered core boards 1 are used, cure shrinkage of each board is so small that the board is excellent in dimensional stability. As a result, variation in thickness of the board can be reduced, so that the inner diameter of the helical coil can be kept constant because reduction in variation of thickness of the board is combined with the formation of the band-shaped conductor patterns 2 on opposite surfaces of the board.

b: Shrinkage of the inorganic sintered core board 1 is small in the planar direction (perpendicular to the direction of thickness), so that coil pitch accuracy is good.

(2) Yield is good for the following reason.

Because both variation in thickness of the inorganic sintered core board 1 and shrinkage of the board in the planar direction are small as described above, the X- and Y-direction arrangement pitch accuracy of inductive devices formed in the inorganic sintered core board 1 is good.

(3) Mass production efficiency is good for the following reason.

a: Yield is good.

b: Because the inorganic sintered core board 1 is used, the strength of the board is so good that the board can be prevented from cracking in the process.

Sixth Embodiment

A sixth embodiment of the invention will be described with reference to FIGS. 3A to 3C and FIGS. 4A to 4D. First, in the band-shaped conductor production step shown in FIG. 3A, an inorganic sintered core board 1A is prepared and a plurality of parallel band-shaped conductor patterns 2 are formed on a surface of the inorganic sintered core board 1A.

Ferrite, ceramic or the like is used as the material of the inorganic sintered core board 1A. For production of high-frequency parts such as a high-frequency coil, a high-Q low-ε material is preferably used as the material of the inorganic sintered core board 1A.

The plurality of parallel band-shaped conductor patterns 2 can be formed by the same process as used in the first embodiment.

Then, in the lamination step shown in FIG. 3B, a plurality of inorganic sintered core boards 1A each having a plurality of parallel band-shaped conductor patterns 2 formed on a surface of the inorganic sintered core board 1A by the step shown in FIG. 3A are piled on one another through interlayer electrically insulating layers (prepregs or adhesive sheets) 3 (inclusive of an electrically insulating layer provided as an uppermost layer to prevent the conductor patterns 2 from being exposed), heated and pressed so as to be laminated integrally. In this manner, a laminated board 10A is obtained. When the interlayer electrically insulating layers 3 are resin layers, the core material may be provided or may be not provided. When an inorganic substance is used as the material of the interlayer electrically insulating layers 3, the inorganic sintered core boards 1A are laminated through the interlayer electrically insulating layers 3 formed in the condition that thin electrically insulating adhesive sheets are provided on opposite surfaces of each interlayer electrically insulating layer 3. An adhesive film GF3600 (made by Hitachi Chemical Co., Ltd.) having moderate fluidity (permitting absorption of irregularities caused by the conductor patterns 2) can be preferably used as each of the adhesive sheets used in this embodiment. The other condition in the lamination step may be the same as in the first embodiment.

After the lamination step, in the slicing step shown in FIG. 3C, the laminated board obtained in the lamination step is sliced along parting lines P crossing the band-shaped conductor patterns 2 by cutting means such as a multi-wire saw or a multi-blade saw. In this manner, laminated sliced bodies 20A are produced.

Then, in the bridging conductor formation step shown in FIG. 4A, bridging conductor patterns 21 are formed on cut surfaces of each laminated sliced body 20A so that end portions of the band-shaped conductor patterns 2 (patterns on each pair of upper and lower core boards 1A) exposed on each cut surface of the laminated sliced body 20A are connected to one another by the bridging conductor patterns 21. The bridging conductor patterns 21 and the band-shaped conductor patterns 2 on the pair of core boards 1A form helical coils. The bridging conductor patterns 21 can be formed in the same manner as the band-shaped conductor patterns 2. That is, the bridging conductor patterns 21 can be formed by a method of patterning conductor layers by using a subtractive method, a semi-additive method or a full additive method.

Thereafter, the protective layer formation step shown in FIG. 4B, the terminal electrode formation step shown in FIG. 4C and the chip separation step shown in FIG. 4D can be performed in the same manner as in the first embodiment. Although the first embodiment shows the case where each laminated sliced body is cut along portions of the interlayer electrically insulating layers in the chip separation step, the sixth embodiment shows the case where each laminated sliced body is cut along parting lines Q1 each located in an intermediate position of the thickness of a corresponding core board 1A. Detailed description of other parts will be omitted because parts the same as or equivalent to those in the first embodiment are denoted by the same reference numerals as those in the first embodiment.

According to the sixth embodiment, the band-shaped conductor patterns 2 can be formed on only one surface of each inorganic sintered core board 1A, so that the process can be simplified. It is possible to avoid lowering of yield caused by misalignment of the front and rear conductor patterns as a problem which occurs when the band-shaped conductor patterns 2 are formed on front and rear surfaces of each board.

Incidentally, the lamination method used in the lamination step in the sixth embodiment may be performed as follows. That is, core boards each having parallel band-shaped conductor patterns formed on a surface of the core board may be laminated so that the surfaces on which the parallel band-shaped conductor patterns are formed are inverted alternately.

Seventh Embodiment

A seventh embodiment of the invention will be described with reference to FIGS. 5A to 5D and FIGS. 6A to 6D. First, in the band-shaped conductor production step shown in FIG. 5A, an inorganic sintered core board 1 is prepared and a plurality of parallel band-shaped conductor patterns 2 are formed on front and rear surfaces of the inorganic sintered core board 1 by use of a plurality of front and rear alignment through-holes 9 formed in the inorganic sintered core board 1. This step is the same as in the first embodiment.

Then, in the first lamination step shown in FIG. 5B, interlayer electrically insulating layers (prepregs or adhesive sheets) 4 are put on front and rear surfaces of the inorganic sintered core board 1 having the parallel band-shaped conductor patterns 2 formed on its front and rear surfaces in the band-shaped conductor production step. The interlayer electrically insulating layers 4 and the inorganic sintered core board 1 are laminated integrally by pressing, heating, etc. In this manner, a laminate 5 is produced so that the front and rear surfaces of the board are covered with the interlayer electrically insulating layers 4. Prepregs or adhesive sheets can be used for forming the interlayer electrically insulating layers 4. For example, a vinyl benzyl resin can be preferably used as each of the prepregs. For example, an adhesive film GF3600 (made by Hitachi Chemical Co., Ltd.) having moderate fluidity (permitting absorption of irregularities caused by the conductor patterns 2) can be preferably used as each of the adhesive sheets. Incidentally, upper and lower surfaces of the laminate 5 are formed as flat surfaces parallel to each other. If necessary, the upper and lower surfaces of the laminate 5 may be preferably polished in order to obtain accuracy of thickness of the laminate 5.

Then, in the second lamination step shown in FIG. 5C, laminates 5 produced in FIG. 5B and adhesive sheets 6 as adhesive layers are piled alternately and laminated integrally by hot pressing or vacuum pressing. In this manner, a laminated board 10B is produced. On this occasion, alignment is required so that the laminates 5 can be piled accurately viewed from above. The alignment can be performed in the same manner as in the first embodiment.

A material exhibiting fluidity as low as possible at the time of pressing is preferably used as the material of the adhesive sheets 6 in the second lamination step. For this reason, for example, a technique of increasing the degree of cure of the resin used as the material of the adhesive sheets may be used. An adhesive film GF3500 (made by Hitachi Chemical Co., Ltd.) having low fluidity can be preferably used as each of the adhesive sheets 6. Incidentally, the thickness of each adhesive sheet 6 is preferably selected to be as small as possible in order to improve pitch accuracy in the laminating direction (for positioning bridging conductor patterns 21). An electrically conductive material may be also used as the material of the adhesive sheets 6. For example, a brass or aluminum board having front and rear surfaces coated with thin films of an adhesive agent may be used as the electrically conductive material. As a result, mechanical strength of the boards and laminates in the step can be improved more greatly, and pitch accuracy can be also improved.

Thereafter, the slicing step shown in FIG. 5D, the bridging conductor formation step shown in FIG. 6A, the protective layer formation step shown in FIG. 6B, the terminal electrode formation step shown in FIG. 6C and the chip separation step shown in FIG. 6D can be performed in the same manner as in the first embodiment. Detailed description of other parts will be omitted because parts the same as or equivalent to those in the fifth embodiment are denoted by the same reference numerals as those in the fifth embodiment.

According to the seventh embodiment, the interlayer electrically insulating layers 4 are formed to be as thin as possible in the first lamination step (and the laminate 5 after the formation of the interlayer electrically insulating layers is polished and ground by a grinder etc. if necessary) so that accuracy of thickness of the laminate 5 is increased. In addition, the adhesive sheets 6 as thin as possible and exhibiting low fluidity at the time of pressing are used in the second lamination step. Accordingly, laminating-direction pitch accuracy of inductive devices included in the laminated board 10B can be improved, so that positional displacement of the bridging conductor patterns 21 relative to the band-shaped conductor patterns 2 can be prevented in the bridging conductor formation step shown in FIG. 6A. Accordingly, greater improvement of yield can be attained. Incidentally, other operations and effects are the same as those in the fifth embodiment.

The seventh embodiment can be also applied to the case where the band-shaped conductor patterns are formed on a single surface of each inorganic sintered core board. In this case, each laminated sliced body can be cut along parting lines each located in an intermediate position of the thickness of a corresponding core board in the same manner as in the second embodiment after the band-shaped conductor patterns formed on each pair of upper and lower core boards are connected to each other by the bridging conductor patterns. Incidentally, the adhesive layers are limited to electrically insulating adhesive layers.

Eighth Embodiment

An eighth embodiment of the invention will be described with reference to FIGS. 10A to 10D. In the band-shaped conductor production step shown in FIG. 10A, a plurality of parallel band-shaped conductor patterns 2 are formed on front and rear surfaces of an organic core board 1 having a core material. The core board 1 is a resin board reinforced with a core material impregnated with a resin. Examples of the core material include glass cloth, resin cloth such as Kepler, and a porous sheet of a fluororesin (tradename: Teflon). Additives may be preferably added to the resin as a main material, for example, to control a linear expansion coefficient and improve electrical characteristic. Examples of the additives include spherical silica filler, ferroelectric powder such as barium titanate powder, and ferrite powder (composite ferrite). For production of high-frequency parts such as a high-frequency coil, a high-Q low-$\epsilon$ material such as a vinyl benzyl resin is preferably used as the resin.

The plurality of parallel band-shaped conductor patterns 2 can be formed by the same process as in the first embodiment.

Figure 10A:
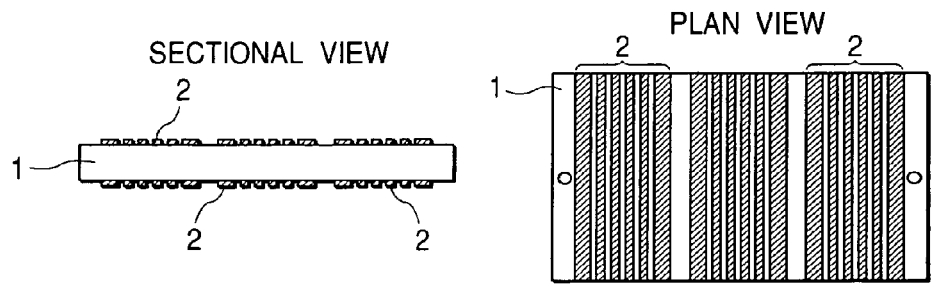
FIGS. 10A to 10D are sectional views and plan views showing a process according to an eighth embodiment of the invention.
Figure 10B:
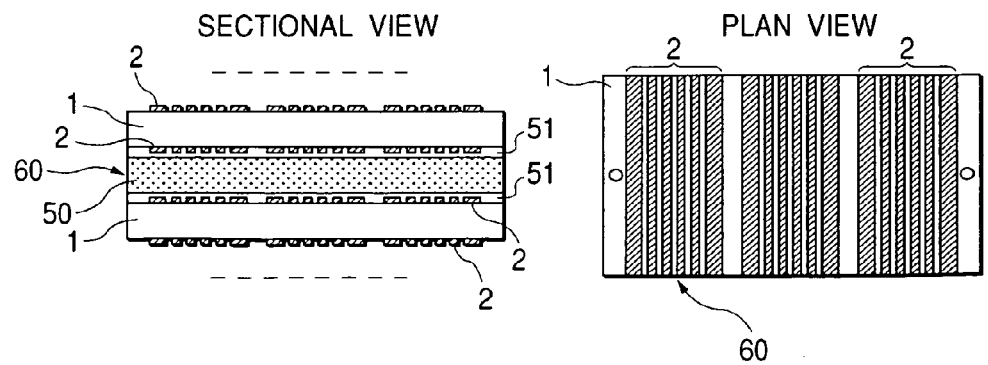

Then, in the lamination step shown in FIG. 10B, core material-including organic core boards 1 each having a plurality of parallel band-shaped conductor patterns 2 formed on its front and rear surfaces in the step shown in FIG. 10A and inorganic sintered core boards 50 are piled alternately through adhesive interlayer electrically insulating layers (adhesive sheets) 51, heated and pressed so as to be laminated integrally. In this manner, a laminated board 60 is obtained.

Figure 10C:
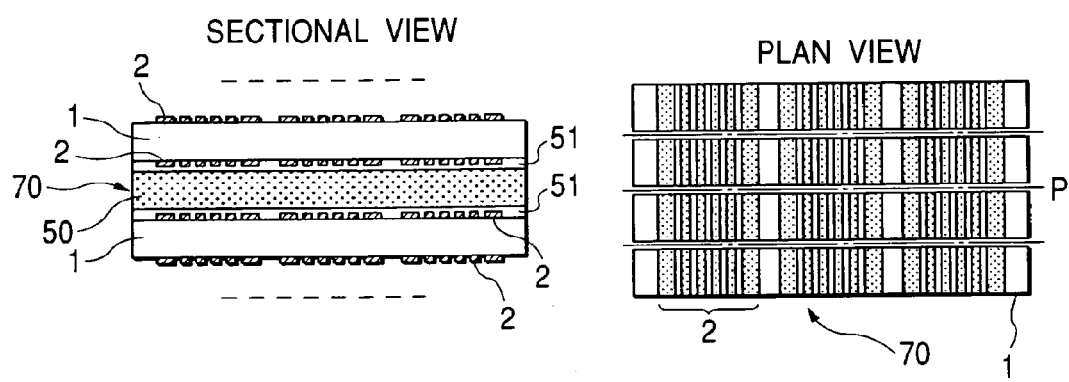

After the lamination step, in the slicing step shown in FIG. 10C, the laminated board 60 obtained in the lamination step is sliced along parting lines P crossing the band-shaped conductor patterns 2 by cutting means such as a multi-wire saw or a multi-blade saw. In this manner, laminated sliced bodies 70 are produced.

Figure 10D:
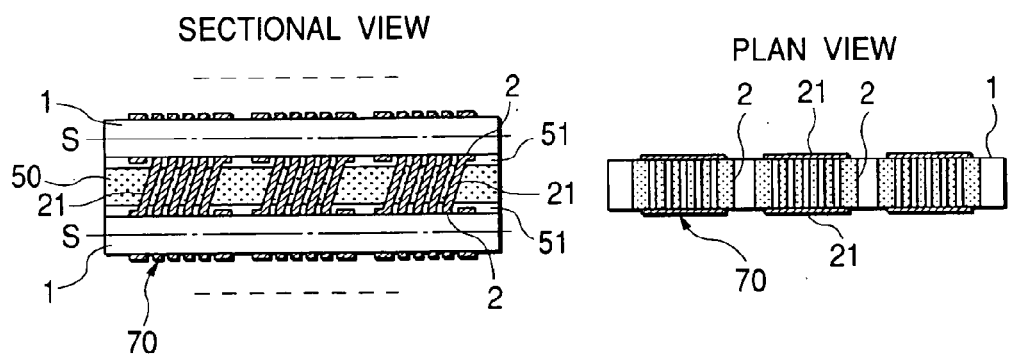

Then, in the bridging conductor formation step shown in FIG. 10D, bridging conductor patterns 21 are formed on cut surfaces of each laminated sliced body 70 so that end portions of the band-shaped conductor patterns 2 exposed on each cut surface of the laminated sliced body 70 are connected to one another by the bridging conductor patterns 21. The bridging conductor patterns 21 and the band-shaped conductor patterns 2 on each pair of organic core boards 1 between which an inorganic sintered core board 50 is interposed form helical coils. The bridging conductor patterns 21 can be formed in the same manner as the band-shaped conductor patterns 2. That is, the bridging conductor patterns 21 can be formed by a method of patterning conductor layers by using a subtractive method, a semi-additive method or a full additive method.

Thereafter, the steps can be carried out in the same manner as the steps shown in FIGS. 2B, 2C and 2D in the first embodiment. Although the first embodiment shows the case where each laminated sliced body is cut along portions of the interlayer electrically insulating layers in the chip separation step, the eighth embodiment shows the case where each laminated sliced body is cut along virtual lines S (shown in FIG. 10D) each located in an intermediate position of the thickness of a corresponding organic core board.

The same effect as in the fifth embodiment can be obtained in the eighth embodiment.

FIG. 9A to 9C show examples of the band-shaped conductor patterns formed on front and rear surfaces of each core board. FIG. 9A shows the parallel band-shaped conductor patterns 2 exemplified in each of the embodiments. FIG. 9B shows a modified example of the band-shaped conductor patterns 2. In FIG. 9B, wide conductors 28 are embedded in end portions of each board so that the wide conductors 28 serve as end portions connected to the band-shaped conductor patterns in order to improve strength of the terminal electrodes. FIG. 9C shows another modified example in which an intermediate portion of the band-shaped conductor patterns 2 is disposed obliquely to form an inductive device of low inductance.

The invention will be described below in detail in connection with Examples.

EXAMPLE 1

Refer to FIGS. 1A to 1C and FIGS. 2A to 2D. The details of the steps are as follows.

(1) Band-Shaped Conductor Production Step

Glass cloth-including vinyl benzyl resin boards (76 mm square and 350 µm thick) were prepared as core material-including organic core boards. Then, parallel band-shaped conductor patterns were formed on front and rear surfaces of each organic core board by copper plating according to a semi-additive process. The patterns having a conductor width of 35 µm (100 µm in end portions) and a conductor height of 35 µm were arranged at conductor intervals of 20 µm. Incidentally, 0.2 mm-diameter holes drilled in two places of each board were used as alignment marks for aligning the boards with respect to the front and rear sides.

(2) Lamination Step

The organic core boards having the band-shaped conductor patterns produced by the aforementioned step and interlayer electrically insulating layers were piled alternately and heated and pressed by vacuum pressing so as to be laminated integrally. In this manner, a laminated board was obtained. The number of laminated core boards was set (at 138) so that a thickness of 76 mm was obtained after pressing. 200 µm-thick glass cloth-including vinyl benzyl resin prepregs were used as the interlayer electrically insulating layers. The boards were aligned by means of pin alignment in the condition that 5 mm-diameter holes were formed in four corners of each board so as to be located in predetermined positions relative to parallel electrode patterns.

(3) Slicing Step

The laminated board was sliced by a multi-wire saw so that a thickness of 0.45 mm was obtained after slicing. In this manner, laminated sliced bodies were obtained. Then, opposite cut surfaces of each laminated sliced body were polished by 50 µm respectively to adjust the thickness of the laminated sliced body to 350 µm.

(4) Bridging Conductor Formation Step

Bridging conductor patterns were formed by copper plating according to a semi-additive process. The patterns having a conductor width of 35 μm (100 μm in end portions) and a conductor height of 35 μm were arranged at conductor intervals of 20 μm.

(5) Protective Layer Formation Step

Protective layers were formed by use of a 50 μm-thick vinyl benzyl resin. Via-holes were formed in the protective layers by a sandblasting method.

(6) Terminal Electrode Formation Step

Terminal electrodes of copper were formed by a semi-additive process. After separation into chips, a 1 μm-thick nickel layer was formed on each terminal electrode and a 2 μm-thick tin layer was formed on the nickel layer by barrel plating.

(7) Chip Separation Step

Each laminated sliced body was cut by dicing.

(8) Yield

When ten sliced boards were produced, yield was as follows. In-process yield was 100%. Characteristic inspection yield was 65% when 100 samples among about 10000 products per one board, that is, among about 100000 products per ten boards, were subjected to characteristic inspection (the main cause of defective products was breaking due to displacement of patterns). Throughout yield was 65%.

In-process yield={(the number of input boards−the number of wear-out boards)/(the number of input boards)}×100 (%)

(The number of wear-out boards: the number of boards removed in a process for reasons of cracking, defective external appearance, etc.)

The judging standard of characteristic inspection was inductance value: reference value ±2%, $Q \geq 45$ at 1 GHz, DC resistance Rdc: reference value ±30%. Variation in inductance value (L value) of good products was 3.2% in terms of $3\sigma/X$ ($\sigma$: standard deviation, X: average).

(Throughout yield)=(in-process yield)×(characteristic inspection yield)

COMPARATIVE EXAMPLE 1

When cloth as a core material was not contained in each core board in Example 1, in-process yield of 20% (the cause of defective products was cracking in a process), inspection yield of 20% (the main cause of defective products was breaking due to displacement of patterns) and throughout yield of 4% were obtained. Variation in inductance value of good products was 6.7% in terms of $3\sigma/X$.

EXAMPLE 2

Refer to FIGS. 3A to 3C and FIGS. 4A to 4D. All the steps except the following points were carried out in the same manner as in Example 1.

(1) Band-Shaped Conductor Production Step

Patterning was performed on a single surface of each board.

(2) Lamination Step

50 μm-thick vinyl benzyl resin prepregs containing no cloth were used as interlayer electrically insulating layers.

(3) Yield

When ten sliced boards were produced, yield was as follows. In-process yield was 100%. Inspection yield was 72% (the main cause of defective products was breaking due to displacement of patterns). Throughout yield was 72%. Variation in inductance value of good products was 2.1% in terms of $3\sigma/X$. Improvement in yield compared with Example 1 was caused by improvement in alignment accuracy of band-shaped conductor patterns making a pair as upper and lower parts.

Incidentally, the lamination method used in the lamination step in Example 2 may be modified so that core boards each having parallel band-shaped conductor patterns formed on its single surface are laminated while the surfaces on which the parallel band-shaped conductor patterns are formed are inverted alternately.

EXAMPLE 3

Refer to FIGS. 5A to 5D and FIGS. 6A to 6D. All the steps except the following points were carried out in the same manner as in Example 1.

(1) First Lamination Step

100 μm-thick vinyl benzyl resin prepregs were laminated on opposite surfaces of a glass cloth-including vinyl benzyl resin board to prepare a laminate. Opposite surfaces of the laminate were polished by 40 μm respectively to adjust the thickness of the board-including laminate to 470 μm (for obtaining accuracy of thickness of the laminate).

(2) Second Lamination Step

20 μm-thick epoxy adhesive sheets of the type exhibiting extremely low fluidity at the time of pressing (adhesive film GF3500 made by Hitachi Chemical Co., Ltd.) were used.

(3) Yield

When ten sliced boards were produced, yield was as follows. In-process yield was 100%. Inspection yield was 83% (the main cause of defective products was breaking due to displacement of patterns). Throughout yield was 83%. Variation in inductance value of good products was 1.5% in terms of $3\sigma/X$. Improvement in yield compared with Example 1 was caused by improvement in pitch accuracy in the vertical direction in sectional views of FIGS. 5A to 5D and FIGS. 6A to 6D.

EXAMPLE 4

All the steps except the following points were carried out in the same manner as in Example 3.

(1) Band-Shaped Conductor Production Step

Patterning was performed on a single surface of each board.

(2) First Lamination Step

A 100 μm-thick vinyl benzyl resin prepreg was laminated on a surface of a glass cloth-including vinyl benzyl resin board on which band-shaped conductor patterns were produced. The prepreg side surface of the laminate was polished by 40 μm to obtain accuracy of thickness of the laminate.

(3) Yield

When ten sliced boards were produced, yield was as follows. In-process yield was 100%. Inspection yield was 86% (the main cause of defective products was breaking due to displacement of patterns). Throughout yield was 86%. Variation in inductance value of good products was 1.4% in terms of $3\sigma/X$. Improvement in yield compared with Example 1 was caused by improvement in pitch accuracy in the vertical direction of the laminates.

Incidentally, the lamination method used in the lamination step in Example 4 may be modified so that core boards each having parallel band-shaped conductor patterns formed on its single surface are laminated while the surfaces on which the parallel band-shaped conductor patterns are formed are inverted alternately.

EXAMPLE 5

Refer to FIGS. 7A to 7D and FIGS. 8A to 8D.

(1) Band-Shaped Conductor Production Step

A 0.1 mm-thick (76 mm-square) stainless steel thin plate (SUS304 material) was used as a transfer board. Parallel band-shaped conductor patterns were formed on the transfer board by a pattern plating method. The patterns having a conductor width of 35 µm (100 µm in end portions) and a conductor height of 35 µm were arranged at conductor intervals of 20 µm. A 150 µm-thick glass cloth-including vinyl benzyl resin board was used as a core board. The core board was produced as follows. A glass cloth-including vinyl benzyl resin prepreg which was half-cured (B stage) was piled on the transfer board and pressed and heated by vacuum pressing. After the prepreg was cured, the transfer board was removed from the prepreg. In this manner, the band-shaped conductor patterns were transferred.

(2) Board Thickness Adjustment Step

A surface of the core board on which the band-shaped conductor patterns were not provided was polished to adjust the thickness of the core board to 400 µm.

(3) Lamination Step

Vacuum pressing was performed by use of 10 µm-thick vinyl benzyl resin adhesive sheets.

(4) Yield

When ten sliced boards were produced, yield was as follows. In-process yield was 100%. Inspection yield was 90% (the main cause of defective products was breaking due to displacement of patterns). Throughout yield was 90%. Variation in inductance value of good products was 1.2% in terms of 3σ/X. Improvement in yield compared with Example 1 was caused by improvement in alignment accuracy of band-shaped conductor patterns making a pair as upper and lower parts and improvement in pitch accuracy in the vertical direction in sectional views of FIGS. 7A to 7D and FIGS. 8A to 8D.

Incidentally, the lamination method used in the lamination step in Example 5 may be modified so that core boards each having parallel band-shaped conductor patterns formed on its single surface are laminated while the surfaces on which the parallel band-shaped conductor patterns are formed are inverted alternately.

EXAMPLE 6

Refer to FIGS. 10A to 10D. The details of the steps are as follows.

(1) Band-Shaped Conductor Production Step

Glass cloth-including vinyl benzyl resin boards (70 mm square and 200 µm thick) were prepared as core material-including organic core boards. Then, parallel band-shaped conductor patterns were formed on front and rear surfaces of each organic core board by copper plating according to a semi-additive process. The patterns having a conductor width of 35 µm and a conductor height of 30 µm were arranged at conductor intervals of 20 µm. Incidentally, 0.2 mm-diameter holes drilled in two places of each board were used as alignment marks for aligning the boards with respect to the front and rear sides.

(2) Lamination Step

The organic core boards having the band-shaped conductor patterns produced by the aforementioned step and inorganic sintered core boards were piled alternately through adhesive interlayer electrically insulating layers (adhesive layers) and heated and pressed so as to be laminated integrally. In this manner, a laminated board was obtained. The number of laminated core boards was set (at 80) so that a thickness of 40 mm was obtained after pressing. 50 µm-thick epoxy adhesive sheets were used as the interlayer electrically insulating layers. The inorganic sintered core boards were made of ferrite (Ni—Co). The boards were aligned by means of pin alignment in the condition that 5 mm-diameter holes were formed in four corners of each board so as to be located in predetermined positions relative to parallel electrode patterns.

(3) Slicing Step

The laminated board was sliced by a multi-wire saw so that a thickness of 0.45 mm was obtained after slicing. In this manner, laminated sliced bodies were obtained. Then, opposite cut surfaces of each laminated sliced body were polished by 50 µm respectively to adjust the thickness of the laminated sliced body to 350 µm.

(4) Bridging Conductor Formation Step

Bridging conductor patterns were formed by copper plating according to a semi-additive process. The patterns having a conductor width of 35 µm and a conductor height of 30 µm were arranged at conductor intervals of 20 µm.

(5) Protective Layer Formation Step

Protective layers were formed by use of a 50 µm-thick vinyl benzyl resin. Via-holes were formed in the protective layers by a sandblasting method.

(6) Terminal Electrode Formation Step

Terminal electrodes of copper were formed by a semi-additive process. After separation into chips, a 1 µm-thick nickel layer was formed on each terminal electrode and a 2 µm-thick tin layer was formed on the nickel layer by barrel plating.

(7) Chip Separation Step

Each laminated sliced body was cut by dicing.

(8) Yield

When ten sliced boards were produced, yield was as follows. In-process yield was 100%. Inspection yield was 88% (the main cause of defective products was breaking due to displacement of patterns). Throughout yield was 88%. Variation in inductance value of good products was 1.3% in terms of 3σ/X. Improvement in yield compared with Example 1 was caused by improvement in pitch accuracy in the vertical direction in sectional views of FIGS. 10A to 10D.

(9) Inductance Value

The inductance value at 50 MHz was increased by about ten times as large as that in the coil obtained in Example 1. The increase in inductance value was caused by increase in magnetic permeability based on use of the inorganic sintered core boards (Ni—Co ferrite).

Boards, electrodes (band-shaped conductor patterns), bonding methods (lamination methods) and yields in Examples and Comparative Examples are collectively shown in Table 1.

TABLE 1-1

| | | Board | | Electrode | |
|---|---|---|---|---|---|
| | | Board used | Thickness [μm] | Surface where electrode is formed | Method for forming electrode |
| 1 | Example 1 | Glass cloth-including VB board | 350 | Front and rear surfaces | Semi-additive |
| 2 | Example 2 | Glass cloth-including VB board | 350 | Single surface | Semi-additive |
| 3 | Example 3 | Glass cloth-including VB board | 350 | Front and rear surfaces | Semi-additive |
| 4 | Example 4 | Glass cloth-including VB board | 350 | Single surface | Semi-additive |
| 5 | Example 5 | Glass cloth-including VB board | 150 | Single surface | Transfer |
| 6 | Example 6 | Glass cloth-including VB board + Ni—Co ferrite board | 200 | Front and rear surfaces | Semi-additive |
| 7 | Comparative Example 1 | VB board without glass cloth | 350 | Front and rear surfaces | Semi-additive |

TABLE 1-2

| | | Yield | | | Variation in L value in good |
|---|---|---|---|---|---|
| | Bonding method | In-process yield [%] | Inspection yield [%] | Throughout yield [%] | products 3σ/X [%] |
| 1 | 200 μm cloth-including VB prepreg | 100 | 65 | 65 | 3.2 |
| 2 | 50 μm VB prepreg without cloth | 100 | 72 | 72 | 2.1 |
| 3 | 100 μm + 100 μm VB prepreg, 20 μm epoxy adhesive sheet | 100 | 83 | 83 | 1.5 |
| 4 | 100 μm VB prepreg, 20 μm epoxy adhesive sheet | 100 | 86 | 86 | 1.4 |
| 5 | 10 μm VB adhesive sheet | 100 | 90 | 90 | 1.2 |
| 6 | 50 μm epoxy adhesive sheet | 100 | 88 | 88 | 1.3 |
| 7 | 200 μm cloth-including VB prepreg | 20 | 20 | 4 | 6.7 |

In-process yield={(the number of input boards−the number of wear-out boards)/(the number of input boards)}×100(%)

The number of wear-out boards: the number of boards removed in a process for reasons of cracking, defective external appearance, etc.

The judging standard of characteristic inspection was L value: reference value ±2%, Q≧45 at 1 GHz, Rdc: reference value±30%.

Throughout yield=in-process yield×inspection yield

VB: vinyl benzyl resin

Comparison in inductance value between Example 1 and Example 6 is shown in Table 2 as follows.

TABLE 2

| | Measurement frequency | Inductance value |
|---|---|---|
| Example 1 | 50 MHz | 30 nH |
| Example 6 | 50 MHz | 300 nH |

Although embodiments and examples of the invention have been described above, the invention is not limited thereto and it will be self-evident to those skilled in the art that various modifications and changes may be made without departing from the scope of claims.

(1) To achieve the foregoing objects, the invention provides an inductive device including: an organic core board having a core material; a plurality of band-shaped conductor patterns formed on front and rear surfaces of the organic core board; and bridging conductor patterns formed on cut surfaces of the organic core board sliced transversely with respect to the band-shaped conductor patterns so that exposed end portions of the band-shaped conductor patterns on each of the cut surfaces of the organic core board are connected to one another by the bridging conductor patterns to thereby provide at least one helical coil.

(2) The invention also provides an inductive device including: an organic core board having a core material; a plurality of band-shaped conductor patterns formed on front and rear surfaces of the organic core board; electrically insulating layers formed on the front and rear surfaces of the organic core board so that the band-shaped conductor patterns are covered with the electrically insulating layers; and bridging conductor patterns formed on cut surfaces of the organic core board sliced transversely with respect to the band-shaped conductor patterns so that exposed end portions of the band-shaped conductor patterns on each of the cut surfaces of the organic core board are connected to one another by the bridging conductor patterns to thereby provide at least one helical coil.

(3) The invention further provides an inductive device including: a plurality of core boards; a plurality of band-shaped conductor patterns formed on a surface of each of the core boards; electrically insulating layers through which the plurality of core boards are integrally laminated to form a laminated board; and bridging conductor patterns formed on cut surfaces of the laminated board sliced transversely with respect to the band-shaped conductor patterns so that exposed end portions of the band-shaped conductor patterns on each of the cut surfaces of the laminated board are connected to one another by the bridging conductor patterns to thereby provide at least one helical coil.

(4) The invention further provides an inductive device including: a plurality of core boards; a plurality of band-shaped conductor patterns formed on a surface of each of the core boards; an electrically insulating layer formed on the surface of each of the core boards so that the band-shaped conductor patterns are covered with the electrically insulating layer; adhesive layers through which the plurality of core boards are integrally laminated to form a laminated board; and bridging conductor patterns formed on cut surfaces of the laminated board sliced transversely with respect to the band-shaped conductor patterns so that exposed end portions of the band-shaped conductor patterns on each of the cut surfaces of the laminated board are connected to one another by the bridging conductor patterns to thereby provide at least one helical coil.

(5) The invention further provides an inductive device according to any one of the paragraphs (1) through (4), wherein a surface of each core board on which the band-shaped conductor patterns are formed is smooth.

(6) The invention further provides an inductive device according to any one of paragraphs (1) through (5), wherein each core board and/or each electrically insulating layer is made of a vinyl benzyl resin or contains a vinyl benzyl resin as a main material.

(7) The invention further provides a method of producing an inductive device, including the steps of: forming a plurality of band-shaped conductor patterns on front and rear surfaces of a plurality of organic core boards each having a core material and integrally laminating the plurality of organic core boards through electrically insulating layers to form a laminated board (lamination step); slicing the laminated board obtained in the lamination step transversely with respect to the band-shaped conductor patterns to thereby form laminated sliced bodies (slicing step); forming bridging conductor patterns on cut surfaces of each laminated sliced body obtained in the slicing step so that exposed end portions of the band-shaped conductor patterns on each of the cut surfaces of the laminated sliced body are connected to one another by the bridging conductor patterns (bridging conductor formation step); and separating each laminated sliced body into individual chips so that each chip includes at least one helical coil formed from the band-shaped conductor patterns and the bridging conductor patterns (separation step).

(8) The invention further provides a method of producing an inductive device, including the steps of: forming a plurality of band-shaped conductor patterns and electrically insulating layers for covering the plurality of band-shaped conductor patterns on front and rear surfaces of a plurality of organic core boards each having a core material and integrally laminating the plurality of organic core boards through adhesive layers to form a laminated board (lamination step); slicing the laminated board obtained in the lamination step transversely with respect to the band-shaped conductor patterns to thereby form laminated sliced bodies (slicing step); forming bridging conductor patterns on cut surfaces of each laminated sliced body obtained in the slicing step so that exposed end portions of the band-shaped conductor patterns on each of the cut surfaces of the laminated sliced body are connected to one another by the bridging conductor patterns (bridging conductor formation step); and separating each laminated sliced body into individual chips so that each chip includes at least one helical coil formed from the band-shaped conductor patterns and the bridging conductor patterns (separation step).

(9) The invention further provides a method of producing an inductive device, including the steps of: forming a plurality of band-shaped conductor patterns on a surface of each of a plurality of core boards and integrally laminating the plurality of core boards through electrically insulating layers to form a laminated board (lamination step); slicing the laminated board obtained in the lamination step transversely with respect to the band-shaped conductor patterns to thereby form laminated sliced bodies (slicing step); forming bridging conductor patterns on cut surfaces of each laminated sliced body obtained in the slicing step so that exposed end portions of the band-shaped conductor patterns on each of the cut surfaces of the laminated sliced body are connected to one another by the bridging conductor patterns (bridging conductor formation step); and separating each laminated sliced body into individual chips so that each chip includes at least one helical coil formed from the band-shaped conductor patterns and the bridging conductor patterns (separation step).

(10) The invention further provides a method of producing an inductive device, including the steps of: forming a plurality of band-shaped conductor patterns and an electrically insulating layer for covering the plurality of band-shaped conductor patterns on a surface of each of a plurality of core boards and integrally laminating the plurality of core boards through adhesive layers to form a laminated board (lamination step); slicing the laminated board obtained in the lamination step transversely with respect to the band-shaped conductor patterns to thereby form laminated sliced bodies (slicing step); forming bridging conductor patterns on cut surfaces of each laminated sliced body obtained in the slicing step so that exposed end portions of the band-shaped conductor patterns on each of the cut surfaces of the laminated sliced body are connected to one another by the bridging conductor patterns (bridging conductor formation step); and separating each laminated sliced body into individual chips so that each chip includes at least one helical coil formed from the band-shaped conductor patterns and the bridging conductor patterns (separation step).

(11) The invention further provides a method of producing an inductive device according to any one of the paragraphs (8) through (10), wherein each electrically insulating layer is polished to adjust the thickness of the inductive device.

(12) The invention further provides a method of producing an inductive device according to the paragraph (9) or (10), wherein a surface of each core board on which the band-shaped conductor patterns are not provided is polished to adjust the thickness of the inductive device.

(13) The invention further provides a method of producing an inductive device according to any one of the paragraphs (7) through (12), wherein the cut surfaces of the laminated sliced bodies after the slicing step are polished to adjust the thickness of the inductive device.

(14) The invention further provides a method of producing an inductive device according to any one of the paragraphs (7) through (13), wherein the band-shaped conductor patterns are provided on each organic core board having the core material or on each core board by means of transferring.

(15) The invention further provides an inductive device including: an inorganic sintered core board; a plurality of band-shaped conductor patterns formed on front and rear surfaces of the inorganic sintered core board; and bridging conductor patterns formed on cut surfaces of the inorganic sintered core board sliced transversely with respect to the band-shaped conductor patterns so that exposed end portions of the band-shaped conductor patterns on each of the cut surfaces of the inorganic sintered core board are connected to one another by the bridging conductor patterns to thereby provide at least one helical coil.

(16) The invention further provides an inductive-device including: an inorganic sintered core board; a plurality of band-shaped conductor patterns formed on front and rear surfaces of the inorganic sintered core board; electrically insulating layers formed on the front and rear surfaces of the inorganic sintered core board so that the band-shaped conductor patterns are covered with the electrically insulating layers; and bridging conductor patterns formed on cut surfaces of the inorganic sintered core board sliced transversely with respect to the band-shaped conductor patterns so that exposed end portions of the band-shaped conductor patterns on each of the cut surfaces of the inorganic sintered core board are connected to one another by the bridging conductor patterns to thereby provide at least one helical coil.

(17) The invention further provides an inductive device including: a plurality of inorganic sintered core boards; a plurality of band-shaped conductor patterns formed on a surface of each of the inorganic sintered core boards; electrically insulating layers through which the plurality of inorganic sintered core boards are integrally laminated to form a laminated board; and bridging conductor patterns formed on cut surfaces of the laminated board sliced transversely with respect to the band-shaped conductor patterns so that exposed end portions of the band-shaped conductor patterns on each of the cut surfaces of the laminated board are connected to one another by the bridging conductor patterns to thereby provide at least one helical coil.

(18) The invention further provides an inductive device including: a plurality of inorganic sintered core boards; a plurality of band-shaped conductor patterns formed on a surface of each of the inorganic sintered core boards; an electrically insulating layer formed on the surface of each of the inorganic sintered core boards so that the band-shaped conductor patterns are covered with the electrically insulating layer; adhesive layers through which the plurality of inorganic-sintered core boards are integrally laminated to form a laminated board; and bridging conductor patterns formed on cut surfaces of the laminated board sliced transversely with respect to the band-shaped conductor patterns so that exposed end portions of the band-shaped conductor patterns on each of the cut surfaces of the laminated board are connected to one another by the bridging conductor patterns to thereby provide at least one helical coil.

(19) The invention further provides an inductive device according to any one of the paragraphs (15) through (18), wherein a surface of each inorganic sintered core board on which the band-shaped conductor patterns are formed is smooth.

(20) The invention further provides a method of producing an inductive device, including the steps of: forming a plurality of band-shaped conductor patterns on front and rear surfaces of a plurality of inorganic sintered core boards and integrally laminating the plurality of inorganic sintered core boards through electrically insulating layers to form a laminated board (lamination step); slicing the laminated board obtained in the lamination step transversely with respect to the band-shaped conductor patterns to thereby form laminated sliced bodies (slicing step); forming bridging conductor patterns on cut surfaces of each laminated sliced body obtained in the slicing step so that exposed end portions of the band-shaped conductor patterns on each of the cut surfaces of the laminated sliced body are connected to one another by the bridging conductor patterns (bridging conductor formation step); and separating each laminated sliced body into individual chips so that each chip includes at least one helical coil formed from the band-shaped conductor patterns and the bridging conductor patterns (separation step).

(21) The invention further provides a method of producing an inductive device, including the steps of: forming a plurality of band-shaped conductor patterns and electrically insulating layers for covering the plurality of band-shaped conductor patterns on front and rear surfaces of a plurality of inorganic sintered core boards and integrally laminating the plurality of inorganic sintered core boards through adhesive layers to form a laminated board (lamination step); slicing the laminated board obtained in the lamination step transversely with respect to the band-shaped conductor patterns to thereby form laminated sliced bodies (slicing step); forming bridging conductor patterns on cut surfaces of each laminated sliced body obtained in the slicing step so that exposed end portions of the band-shaped conductor patterns on each of the cut surfaces of the laminated sliced body are connected to one another by the bridging conductor patterns (bridging conductor formation step); and separating each laminated sliced body into individual chips so that each chip includes at least one helical coil formed from the band-shaped conductor patterns and the bridging conductor patterns (separation step).

(22) The invention further provides a method of producing an inductive device, including the steps of: forming a plurality of band-shaped conductor patterns on a surface of each of a plurality of inorganic sintered core boards and integrally laminating the plurality of inorganic sintered core boards through electrically insulating layers to form a laminated board (lamination step); slicing the laminated board obtained in the lamination step transversely with respect to the band-shaped conductor patterns to thereby form laminated sliced bodies (slicing step); forming bridging conductor patterns on cut surfaces of each laminated sliced body obtained in the slicing step so that exposed end portions of the band-shaped conductor patterns on each of the cut surfaces of the laminated sliced body are connected to one another by the bridging conductor patterns (bridging conductor formation step); and separating Beach laminated sliced body into individual chips so that each chip includes at least one helical coil formed from the band-shaped conductor patterns and the bridging conductor patterns (separation step).

(23) The invention further provides a method of producing an inductive device, including the steps of: forming a plurality of band-shaped conductor patterns and an electrically insulating layer for covering the plurality of band-shaped conductor patterns on a surface of each of a plurality of inorganic sintered core boards and integrally laminating the plurality of inorganic sintered core boards through adhesive layers to form a laminated board (lamination step); slicing the laminated board obtained in the lamination step transversely with respect to the band-shaped conductor patterns to thereby form laminated sliced bodies (slicing step); forming bridging conductor patterns on cut surfaces of each laminated sliced body obtained in the slicing step so that exposed end portions of the band-shaped conductor patterns on each of the cut surfaces of the laminated sliced body are connected to one another by the bridging conductor patterns (bridging conductor formation step); and separating each laminated sliced body into individual chips so that each chip includes at least one helical coil formed from the band-shaped conductor patterns and the bridging conductor patterns (separation step).

(24) The invention further provides a method of producing an inductive device, including the steps of: forming a plurality of band-shaped conductor patterns on rear and front surfaces of organic core boards each having a core material and integrally laminating the organic core boards and inorganic sintered core boards alternately through electrically insulating adhesive layers to form a laminated board (lamination step); slicing the laminated board obtained in the lamination step transversely with respect to the band-shaped conductor patterns to thereby form laminated sliced bodies (slicing step); forming bridging conductor patterns on cut surfaces of each laminated sliced body obtained in the slicing step so that exposed end portions of the band-shaped conductor patterns on each of the cut surfaces of the laminated sliced body are connected to one another by the bridging conductor patterns (bridging conductor formation step); and separating each laminated sliced body into individual chips so that each chip includes at least one helical coil formed from the band-shaped conductor patterns and the bridging conductor patterns (separation step).

(25) The invention further provides a method of producing an inductive device according to the paragraphs (20) through (24), wherein each electrically insulating layer is polished to adjust the thickness of the inductive device.

(26) The invention further provides a method of producing an inductive device according to the paragraph (22) or (23), wherein a surface of each inorganic sintered core board on which the band-shaped conductor patterns are not provided is polished to adjust the thickness of the inductive device.

(27) The invention further provides a method of producing an inductive device according to any one of the paragraphs (20) through (26), wherein the cut surfaces of the laminated sliced bodies after the slicing step are polished to adjust the thickness of the inductive device.

(28) The invention further provides a method of producing an inductive device according to any one of the paragraphs (20) through (27), wherein an inorganic sintered body used in each inorganic sintered core board is made of a porous ceramic substance.

(29) The invention further provides a method of producing an inductive device according to any one of the paragraphs (20) through (27), wherein an inorganic sintered body used in each inorganic sintered core board is made of a magnetic substance.

What is claimed is:

1. An inductive device comprising:
   an inorganic sintered core board;
   a plurality of band-shaped conductor patterns having exposed end portions on front and rear surfaces of said inorganic sintered core board; and
   a plurality of bridging conductor patterns formed on cut surfaces of said inorganic sintered core board sliced transversely with respect to said band-shaped conductor patterns so that the exposed end portions of said band-shaped conductor patterns on each of said front and rear surfaces of said inorganic sintered core board are connected to one another by said plurality of bridging conductor patterns to thereby provide at least one helical coil.

2. An inductive device comprising:
   an inorganic sintered core board;
   a plurality of band-shaped conductor patterns having exposed end portions on front and rear surfaces of said inorganic sintered core board;
   electrically insulating layers formed on said front and rear surfaces of said inorganic sintered core board so that said band-shaped conductor patterns are covered with said electrically insulating layers; and
   a plurality of bridging conductor patterns formed on cut surfaces of said inorganic sintered core board sliced transversely with respect to said band-shaped conductor patterns so that the exposed end portions of said band-shaped conductor patterns on each of said front and rear surfaces of said inorganic sintered core board are connected to one another by said plurality of bridging conductor patterns to thereby provide at least one helical coil.

3. An inductive device according to any one of claims 1 or 2, wherein a surface of each inorganic sintered core board on which said band-shaped conductor patterns are formed is smooth.

4. A method of producing an inductive device, comprising:
   forming a plurality of band-shaped conductor patterns having exposed end portions on front and rear surfaces of a plurality of inorganic sintered core boards and integrally laminating said plurality of inorganic sintered core boards through electrically insulating layers to form a laminated board (lamination);
   slicing said laminated board obtained in the lamination transversely with respect to said band-shaped conductor patterns to thereby form laminated sliced bodies (slicing);
   forming a plurality of bridging conductor patterns on cut surfaces of each laminated sliced body obtained in the slicing so that the exposed end portions of said band-shaped conductor patterns on each of said front and rear surfaces of said laminated sliced body are connected to one another by individual of said plurality of bridging conductor patterns (bridging conductor formation); and
   separating each laminated sliced body into individual chips so that each chip includes at least one helical coil formed from said band-shaped conductor patterns and said plurality of bridging conductor patterns (separation).

5. A method of producing an inductive device, comprising:
   forming a plurality of band-shaped conductor patterns and electrically insulating layers for covering said plurality of band-shaped conductor patterns having exposed end portions on front and rear surfaces of a plurality of inorganic sintered core boards and integrally laminating said plurality of inorganic sintered core boards through adhesive layers to form a laminated board (lamination);
   slicing said laminated board obtained in the lamination transversely with respect to said band-shaped conductor patterns to thereby form laminated sliced bodies (slicing);
   forming a plurality of bridging conductor patterns on cut surfaces of each laminated sliced body obtained in the slicing so that the exposed end portions of said band-shaped conductor patterns on each of said front and rear surfaces of said laminated sliced body are connected to one another by individual of said plurality of bridging conductor patterns (bridging conductor formation); and separating each laminated sliced body into individual chips so that each chip includes at least one helical coil formed from said band-shaped conductor patterns and said plurality of bridging conductor patterns (separation).

6. A method of producing an inductive device according to any one of claims 4 or 5, wherein each electrically insulating layer is polished to adjust the thickness of said inductive devices.

7. A method of producing an inductive device according to any one of claims 4 or 5, wherein said cut surfaces of said laminated sliced bodies after the slicing step are polished to adjust the thickness of said inductive device.

8. A method of producing an inductive device according to any one of claims 4 or 5, wherein an inorganic sintered body used in each inorganic sintered core board is made of a porous ceramic substance.

9. A method of producing an inductive device according to any one of claims 4 or 5, wherein an inorganic sintered body used in each inorganic sintered core board is made of a magnetic substance.

10. A method of producing an inductive device, comprising:

forming a plurality of band-shaped conductor patterns having exposed end portions on front and rear surfaces of each of core boards;

integrally laminating the core boards through electrically insulating layers to form a laminated board, slicing said laminated board transversely with respect to said band-shaped conductor patterns;

forming a plurality of bridging conductor patterns on a cut surface of the sliced laminated board, so that the exposed end portions of said band-shaped conductor patterns on the front and rear surface are connected to one another by individual of the plurality of bridging conductor patterns; and separating into individual chips so that each chip includes at least one helical coil formed from the band-shaped conductor patterns and the plurality of bridging conductor patterns.

11. An inductive device comprising:

a core board;

a plurality of conductive layers, each layer including a plurality of band-shaped conductor patterns having exposed end portions on front and rear surfaces of said core board;

a plurality of bridging conductor patterns formed on a side surface of said core board, end portions of said band-shaped conductor patterns on said front and rear surfaces being connected to one another by said plurality of bridging conductor patterns to thereby provide at least one helical coil.

12. The inductive device as claimed in claim 11, wherein said conductive layers are formed on front and rear surfaces of said core board.

13. The inductive device as claimed in claim 11, wherein a plurality of core boards are provided, said conductive layer is formed on one surface of said core board, and the plural core boards are laminated through a insulating layer.

14. The inductive device as claimed in claim 11, wherein said core board is inorganic sintered core board.

15. The inductive device as claimed in claim 11, wherein said core board is an organic core board having filler.

\* \* \* \* \*